US012016157B2

(12) United States Patent
Malouin et al.

(10) Patent No.: US 12,016,157 B2
(45) Date of Patent: Jun. 18, 2024

(54) ACTIVELY COOLED HEAT-DISSIPATION LIDS FOR COMPUTER PROCESSORS AND ASSEMBLIES

(71) Applicant: JetCool Technologies Inc., Littleton, MA (US)

(72) Inventors: Bernard Malouin, Westford, MA (US); Jordan Mizerak, Belmont, MA (US)

(73) Assignee: JetCool Technlologies Inc., Littleton, MA (US)

( * ) Notice: Subject to any disclaimer, the term of this patent is extended or adjusted under 35 U.S.C. 154(b) by 0 days.

(21) Appl. No.: 18/116,409

(22) Filed: Mar. 2, 2023

(65) Prior Publication Data
US 2023/0284421 A1  Sep. 7, 2023

Related U.S. Application Data

(60) Provisional application No. 63/342,348, filed on May 16, 2022, provisional application No. 63/316,527, filed on Mar. 4, 2022.

(51) Int. Cl.
  *H05K 7/20* (2006.01)
  *G06F 1/20* (2006.01)
(52) U.S. Cl.
  CPC ......... *H05K 7/20427* (2013.01); *G06F 1/206* (2013.01); *H05K 7/20254* (2013.01); *H05K 7/20272* (2013.01)
(58) Field of Classification Search
  None
  See application file for complete search history.

(56) References Cited

U.S. PATENT DOCUMENTS

| 236,519 A | 1/1881 | Walsh |
| 3,765,728 A | 10/1973 | Peruglia |

(Continued)

FOREIGN PATENT DOCUMENTS

| CN | 102414813 B | 4/2014 |
| CN | 10756724 A | 1/2018 |

(Continued)

OTHER PUBLICATIONS

Celli, "Compressible fluids," retrieved from the Internet: http://galileo.phys.virginia.edu/classes/311/notes/compflu2/node1.html, 1997.

*Primary Examiner* — Courtney L Smith
(74) *Attorney, Agent, or Firm* — Grady L. White; Potomac Law Group, PLLC

(57) ABSTRACT

Actively cooled heat-dissipation lid for removing excess heat from heat-generating devices attached to printed circuit boards, processor assemblies and other electronic devices, the actively cooled heat-dissipation lid comprising a first plate configured to be placed in thermal communication with a heat-generating device, a raised sidewall to facilitate fastening the actively cooled heat-dissipation lid to the printed circuit board or processor assembly, and thereby defining a device chamber for the heat-generating devices on the printed circuit board to reside. A second raised sidewall extends from the opposite surface of the first plate to join with a second plate in a spaced relation to the first plate, wherein the opposite surface of the first plate, the second raised sidewall and the second plate together define a fluid chamber that is adjacent to the device chamber, the fluid chamber being configured to prevent any cooling fluid flowing therethrough to enter the adjacent device chamber. An inlet conduit in fluid communication with the fluid chamber is configured to admit coolant fluid from a pressurized source to pass into the fluid chamber to absorb heat from the second surface of the first plate in thermal com- (Continued)

munication with the heat-generating device. An outlet conduit in fluid communication with the fluid chamber is configured to let warmed coolant fluid flow out of the fluid chamber and into a closed loop fluid-cooling system, where the coolant fluid is then re-cooled before being pumped back into the fluid chamber via the inlet conduit.

6 Claims, 13 Drawing Sheets

(56) References Cited

U.S. PATENT DOCUMENTS

| | | |
|---|---|---|
| 3,841,671 A | 10/1974 | Walker |
| 3,980,112 A | 9/1976 | Basham |
| 4,062,572 A | 12/1977 | Davis |
| 4,090,539 A | 5/1978 | Krupp |
| 4,696,496 A | 9/1987 | Guelis et al. |
| 4,796,924 A | 1/1989 | Kosugi et al. |
| 4,890,865 A | 1/1990 | Hosono et al. |
| 4,922,971 A | 5/1990 | Grantham |
| 5,021,924 A | 6/1991 | Kieda et al. |
| 5,088,005 A | 2/1992 | Ciaccio |
| 5,249,358 A | 10/1993 | Tousignant et al. |
| 5,263,536 A | 11/1993 | Hulburd et al. |
| 5,285,351 A | 2/1994 | Ikeda |
| 5,309,319 A | 5/1994 | Messina |
| 5,316,075 A | 5/1994 | Quon et al. |
| 5,349,831 A | 9/1994 | Daikoku et al. |
| 5,401,064 A | 3/1995 | Guest |
| 5,491,363 A | 2/1996 | Yoshikawa |
| 5,547,231 A | 8/1996 | Sharp |
| 5,611,373 A | 3/1997 | Ashcraft |
| 5,687,993 A | 11/1997 | Brim |
| 5,720,325 A | 2/1998 | Grantham |
| 5,959,351 A | 9/1999 | Sasaki et al. |
| 5,999,404 A | 12/1999 | Hileman |
| 6,105,373 A * | 8/2000 | Watanabe ............... F25B 21/02 62/3.7 |
| 6,144,013 A * | 11/2000 | Chu .................... H05K 5/0212 392/416 |
| 6,366,462 B1 | 4/2002 | Chu et al. |
| 6,528,878 B1 | 3/2003 | Daikoku et al. |
| 6,546,951 B1 | 4/2003 | Armenia et al. |
| 6,550,263 B2 | 4/2003 | Patel et al. |
| 6,550,815 B2 | 4/2003 | Zitkowic, Jr. et al. |
| 6,729,383 B1 | 5/2004 | Cannell et al. |
| 6,952,346 B2 | 10/2005 | Tilton et al. |
| 6,973,801 B1 | 12/2005 | Campbell et al. |
| 7,007,506 B2 * | 3/2006 | Kubo ................. H05K 7/20309 165/170 |
| 7,104,312 B2 | 9/2006 | Goodson et al. |
| 7,149,087 B2 | 12/2006 | Wilson et al. |
| 7,223,494 B2 * | 5/2007 | Takeshita ............ H01M 50/209 348/E5.025 |
| 7,233,494 B2 | 6/2007 | Campbell et al. |
| 7,241,423 B2 | 7/2007 | Golbig et al. |
| 7,265,976 B1 | 9/2007 | Knight |
| 7,277,283 B2 | 10/2007 | Campbell et al. |
| 7,511,957 B2 | 3/2009 | Campbell et al. |
| 7,787,248 B2 | 8/2010 | Campbell et al. |
| 7,802,442 B2 | 9/2010 | Bezama et al. |
| 7,866,173 B2 | 1/2011 | Brunschwiler et al. |
| 7,916,483 B2 | 3/2011 | Campbell et al. |
| 7,978,473 B2 | 7/2011 | Campbell et al. |
| 7,992,627 B2 | 8/2011 | Bezama et al. |
| 8,059,405 B2 | 11/2011 | Campbell et al. |
| 8,266,802 B2 | 9/2012 | Campbell et al. |
| 8,824,146 B2 | 9/2014 | Brok et al. |
| 8,912,643 B2 | 12/2014 | Bock et al. |
| 8,929,080 B2 | 1/2015 | Campbell et al. |
| 8,944,151 B2 | 2/2015 | Flotta et al. |
| 8,981,556 B2 * | 3/2015 | Joshi ................... H01L 23/4735 257/714 |
| 9,165,857 B2 | 10/2015 | Song et al. |
| 9,247,672 B2 * | 1/2016 | Mehring ............ H05K 7/20136 |
| 9,252,069 B2 * | 2/2016 | Bhunia ............... H01L 23/3735 |
| 9,445,529 B2 | 9/2016 | Chainer et al. |
| 9,484,283 B2 | 11/2016 | Joshi et al. |
| 9,521,787 B2 | 12/2016 | Chainer et al. |
| 9,530,818 B2 | 12/2016 | Stern et al. |
| 9,559,038 B2 | 1/2017 | Schmit et al. |
| 9,560,790 B2 | 1/2017 | Joshi et al. |
| 9,622,379 B1 | 4/2017 | Campbell et al. |
| 9,638,477 B1 | 5/2017 | Choi et al. |
| 9,653,378 B2 | 5/2017 | Hou et al. |
| 9,750,159 B2 | 8/2017 | Campbell et al. |
| 9,852,963 B2 | 12/2017 | Shedd et al. |
| 9,901,008 B2 | 2/2018 | Shedd et al. |
| 9,903,664 B2 | 2/2018 | Joshi |
| 10,078,354 B2 | 9/2018 | Eriksen et al. |
| 10,096,537 B1 | 10/2018 | Chen et al. |
| 10,152,096 B1 | 12/2018 | Chen et al. |
| 10,228,735 B2 | 3/2019 | Kulkarni et al. |
| 10,270,220 B1 | 4/2019 | Eppich et al. |
| 10,285,309 B2 | 5/2019 | James et al. |
| 10,306,802 B1 | 5/2019 | Ditri et al. |
| 10,426,062 B1 | 9/2019 | Saunders |
| 10,473,252 B2 | 11/2019 | Oberdorfer et al. |
| 10,512,152 B2 | 12/2019 | Smith et al. |
| 10,561,040 B1 | 2/2020 | Lunsman et al. |
| 10,651,112 B2 | 5/2020 | Malouin, Jr. et al. |
| 10,665,529 B2 | 5/2020 | Smith et al. |
| 10,903,141 B2 | 1/2021 | Malouin, Jr. et al. |
| 10,985,089 B2 | 4/2021 | Hart et al. |
| 11,018,077 B2 | 5/2021 | Smith et al. |
| 11,096,313 B2 | 8/2021 | Amos et al. |
| 11,322,426 B2 | 5/2022 | Malouin, Jr. et al. |
| 11,439,037 B2 | 9/2022 | Subrahmanyam et al. |
| 11,594,470 B2 | 2/2023 | Smith et al. |
| 11,710,678 B2 * | 7/2023 | Ganti ..................... F04B 45/043 62/3.7 |
| 2002/0075651 A1 | 6/2002 | Newton et al. |
| 2002/0113142 A1 | 8/2002 | Patel et al. |
| 2004/0051308 A1 | 3/2004 | Coates |
| 2004/0194492 A1 | 10/2004 | Tilton et al. |
| 2005/0143000 A1 * | 6/2005 | Eisele ................ H05K 7/20927 257/E23.098 |
| 2005/0210906 A1 | 9/2005 | Laufer et al. |
| 2005/0280994 A1 | 12/2005 | Yazawa |
| 2006/0042825 A1 | 3/2006 | Lu et al. |
| 2006/0250773 A1 | 11/2006 | Campbell et al. |
| 2006/0250774 A1 | 11/2006 | Campbell et al. |
| 2007/0017659 A1 | 1/2007 | Brunschwiler et al. |
| 2007/0091569 A1 | 4/2007 | Campbell et al. |
| 2007/0121294 A1 | 5/2007 | Campbell et al. |
| 2007/0121299 A1 | 5/2007 | Campbell et al. |
| 2007/0221364 A1 | 9/2007 | Lai et al. |
| 2007/0272392 A1 | 11/2007 | Ghosh et al. |
| 2007/0274045 A1 | 11/2007 | Campbell et al. |
| 2007/0295480 A1 | 12/2007 | Campbell et al. |
| 2008/0037221 A1 | 2/2008 | Campbell et al. |
| 2008/0278913 A1 | 11/2008 | Campbell et al. |
| 2009/0013258 A1 | 1/2009 | Hintermeister et al. |
| 2009/0032937 A1 | 2/2009 | Mann et al. |
| 2009/0284821 A1 | 11/2009 | Valentin et al. |
| 2009/0294105 A1 | 12/2009 | Sundararajan et al. |
| 2009/0294106 A1 | 12/2009 | Flotta et al. |
| 2009/0314467 A1 * | 12/2009 | Campbell ........... H01L 23/4735 165/80.4 |
| 2009/0316360 A1 | 12/2009 | Campbell et al. |
| 2010/0276026 A1 | 11/2010 | Powell et al. |
| 2010/0290190 A1 | 11/2010 | Chester et al. |
| 2010/0328882 A1 | 12/2010 | Campbell et al. |
| 2010/0328888 A1 | 12/2010 | Campbell et al. |
| 2010/0328889 A1 | 12/2010 | Campbell et al. |
| 2011/0277491 A1 | 11/2011 | Wu et al. |
| 2012/0048515 A1 | 3/2012 | Bhunia et al. |
| 2012/0063091 A1 | 3/2012 | Dede et al. |
| 2012/0160459 A1 | 6/2012 | Flotta et al. |
| 2012/0212907 A1 * | 8/2012 | Dede ................... H01L 23/4735 361/689 |
| 2014/0085823 A1 | 3/2014 | Campbell et al. |

(56) References Cited

U.S. PATENT DOCUMENTS

| | | |
|---|---|---|
| 2014/0124167 A1 | 5/2014 | Campbell et al. |
| 2014/0126150 A1 | 5/2014 | Song et al. |
| 2014/0158326 A1 | 6/2014 | Lyon |
| 2014/0190668 A1 | 7/2014 | Joshi et al. |
| 2014/0204532 A1 | 7/2014 | Mehring |
| 2014/0205632 A1 | 7/2014 | Gruber et al. |
| 2014/0264759 A1 | 9/2014 | Koontz et al. |
| 2014/0284787 A1 | 9/2014 | Joshi |
| 2014/0293542 A1 | 10/2014 | Vetrovec |
| 2014/0352937 A1 | 12/2014 | Draht |
| 2015/0043164 A1 | 2/2015 | Joshi |
| 2015/0096722 A1 | 4/2015 | Zweiback et al. |
| 2015/0131224 A1 | 5/2015 | Barina et al. |
| 2015/0208549 A1 | 7/2015 | Shedd et al. |
| 2016/0014932 A1 | 1/2016 | Best et al. |
| 2016/0120058 A1 | 4/2016 | Shedd et al. |
| 2016/0143184 A1 | 5/2016 | Campbell et al. |
| 2016/0278239 A1 | 9/2016 | Chainer et al. |
| 2017/0092565 A1 | 3/2017 | Chen et al. |
| 2017/0150649 A1 | 5/2017 | Chester et al. |
| 2017/0179001 A1 | 6/2017 | Brunschwiler et al. |
| 2017/0347487 A1 | 11/2017 | Rudnicki et al. |
| 2018/0027695 A1 | 1/2018 | Wakino et al. |
| 2018/0040538 A1 | 2/2018 | Schuderer et al. |
| 2018/0090417 A1 | 3/2018 | Gutala et al. |
| 2018/0124949 A1 | 5/2018 | Marroquin et al. |
| 2019/0013258 A1 | 1/2019 | Malouin, Jr. et al. |
| 2019/0029105 A1* | 1/2019 | Smith ............... H01L 23/473 |
| 2019/0195399 A1 | 6/2019 | Nguyen et al. |
| 2019/0235449 A1 | 8/2019 | Slessman et al. |
| 2019/0289749 A1 | 9/2019 | Dariavach et al. |
| 2019/0348345 A1 | 11/2019 | Parida et al. |
| 2020/0011620 A1 | 1/2020 | Sherrer et al. |
| 2020/0015383 A1 | 1/2020 | Gao |
| 2020/0027819 A1 | 1/2020 | Smith et al. |
| 2020/0033075 A1 | 1/2020 | Veto et al. |
| 2020/0100396 A1 | 3/2020 | Iyengar et al. |
| 2020/0168526 A1 | 5/2020 | Malouin, Jr. et al. |
| 2020/0214126 A1 | 7/2020 | Nakashima et al. |
| 2020/0253092 A1 | 8/2020 | Chainer et al. |
| 2020/0296862 A1 | 9/2020 | Iyengar et al. |
| 2020/0312746 A1 | 10/2020 | Smith et al. |
| 2020/0328139 A1 | 10/2020 | Chiu et al. |
| 2020/0350231 A1 | 11/2020 | Shen et al. |
| 2021/0134703 A1 | 5/2021 | Malouin, Jr. et al. |
| 2021/0265240 A1 | 8/2021 | Smith et al. |
| 2021/0351108 A1 | 11/2021 | Diglio et al. |
| 2022/0151097 A1 | 5/2022 | McManis et al. |
| 2022/0230937 A1 | 7/2022 | Malouin et al. |
| 2022/0253112 A1 | 8/2022 | Hinton et al. |

FOREIGN PATENT DOCUMENTS

| | | |
|---|---|---|
| CN | 105027021 B | 4/2019 |
| EP | 3188230 A1 | 7/2017 |
| KR | 20110028428 A | 3/2011 |
| KR | 20190077920 A | 7/2019 |
| WO | 2019018597 A1 | 1/2019 |

\* cited by examiner

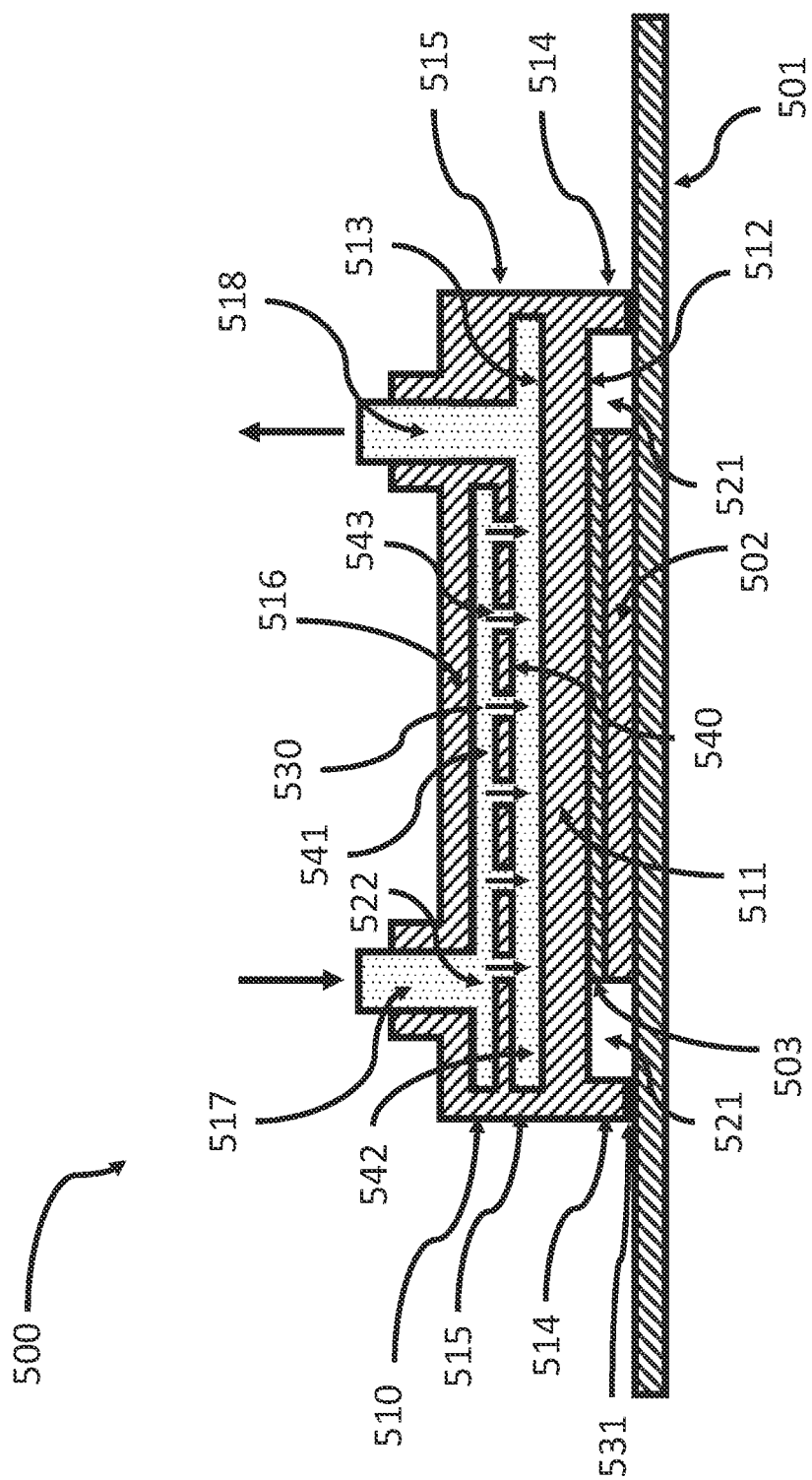

ACTIVELY COOLED HEAT-DISSIPATION LIDS FOR COMPUTER PROCESSORS AND ASSEMBLIES

TECHNICAL FIELD

Heat-management systems for high-powered, high-performance computer processors, processor assemblies and electronic devices, and more particularly, heat-management systems involving liquid cooling systems and methods.

BACKGROUND ART

Modern computer processors (e.g., CPUs, GPUs, FPGAs, ASICs, etc.) and processor assemblies used in high-performance computing applications, such as supercomputing, artificial intelligence, networking, and other processing-intense applications, typically include a very large number of very small semiconductor dies arranged and attached to printed circuit boards in increasingly dense patterns. Because each one of these small and densely packed semiconductor dies includes one or more heat-generating devices, processing assemblies in electronic devices comprising such densely packed semiconductor dies can generate an enormous amount of heat during operation. The additional heat can raise the internal temperature of the processing assemblies. If the internal temperature of a processing assembly exceeds a certain maximum safe operating temperature, the excessive heat could damage the processing assembly and thereby significantly reduce the operating lifespan of the processing assembly or, in some cases, may cause a catastrophic failure of the processing assembly.

Accordingly, as semiconductor dies continue to get smaller, and processing assemblies for electronic devices continue to be designed and manufactured to hold increasingly larger numbers of densely packed semiconductor dies, the demand for better and more efficient methods for removing heat from processing assemblies for electronic devices will continue to rise.

Removing excess heat generated by many very small, densely packed semiconductor dies is technically challenging because small semiconductor dies have very limited surface areas available for cooling via thermal conduction. Attempts to address this problem have included placing an integrated heat spreader (IHS), sometimes referred to as a "lid," in thermal communication with the semiconductor dies in processor assemblies. The lid is typically formed from a thermally conductive material and, when placed in thermal communication with a heated surface, tends to draw the heat from the heated surface and spread the heat into a larger area having a higher rate of heat dissipation. This lowers the temperature of the processor assembly and makes it easier to keep the processor assembly cool. Notably, however, the operation of such conventional integrated heat spreaders, or lids, is entirely passive.

Moreover, after the lid is attached to the semiconductor dies, a heat-sink is typically attached to the lid to promote convection cooling, such as with air or a liquid coolant. Typically, a thermal interface material (TIM) must be disposed between the lid and the heat-sink, to avoid air gaps forming a thermal blanket between the microscopically rough lid and heat-sink mating surfaces. Unfortunately, however, the TIM creates an extra layer of resistance that the heat-sink must overcome, which decreases the heat transfer efficiency, and therefore limits the heat dissipation and reduces processor performance. Furthermore, installing heat-sinks and their thermal interface materials on the lids is traditionally a substantially manual process, which increases manufacturing time, as well as the amount of manual labor required to produce processing assemblies with adequate cooling capabilities.

FIG. 1 shows an example of a prior art processing assembly 100 comprising a traditional lid 100. As shown in FIG. 1, a heat-generating device 102, such as a semiconductor die, is disposed on a printed circuit board 101. A passive lid 104, typically formed from a thermally conductive metal, is disposed on printed circuit board 101 via a fastener 105, often an adhesive. The passive lid 104 is placed in thermal communication with the heat-generating device 102 via a first thermal interface material 103 (known to those skilled in the art as TIM1), allowing heat to spread from the heat-generating device 102 having a small area footprint into the larger area footprint of the passive lid 104. The first thermal interface material 103 often provides a structural bond between the lid 104 and the heat-generating device 102, in addition to providing thermal communication, but need not do so in all cases. A heat-sink 107 is then placed in thermal communication with the passive lid 104 via a second thermal interface material 106 (known to those skilled in the art as TIM2). The second thermal interface material 106 typically does not provide a structural bond between the heat-sink 107 and the passive lid 104, though fasteners (not shown) are often included to do so. The heat-sink 107 is typically formed from a thermally conductive metal, and transmits the heat from the passive lid 104, via the second thermal interface material 106, to be taken away via a flowing coolant 111 in fluid chamber 110. The flowing coolant 111 enters the heat-sink 107 via an inlet conduit 108, passes through the fluid chamber 110 to remove heat from the heat-sink 107 that originated at the heat-generating device 102 before passing through the TIM1 103, the lid 104, the TIM2 106, and any interstitial void of heat-sink 107.

Unfortunately, there are multiple inefficiencies associated with using the processing assembly shown in FIG. 1 to transmit the heat from heat-generating device 102 into the flowing coolant 111. For one thing, the existence of multiple thermal interface materials 103 and 106 introduces additional resistance against the desired flow of heat from the heat-generating device 102 to the flowing coolant 111. The additional resistance problem is exacerbated as power levels of heat-generating devices increases. Furthermore, the insertion of the passive lid 104 and the heat-sink 107 into the processing assembly introduce additional interfaces between the origin heat-generating device 102 and the destination flowing coolant 111 that the device must overcome, despite the fact that both the passive lid 104 and the heat-sink 107 are typically formed from thermally conductive metals.

Therefore, there is considerable need in the computer and electronic device industries for a better and more efficient solution to address and overcome the problems and limitations associated with using traditional passive lids to increase the transfer of heat between power dense semiconductor dies and the coolant used to remove excess heat from processing assemblies.

DISCLOSURE OF INVENTION

Embodiments of the present invention address the aforementioned problems and needs by providing an actively cooled heat-dissipation lid for removing excess heat from heat-generating devices attached to printed circuit boards, processor assemblies and other electronic devices. The actively cooled heat-dissipation lid comprises a first plate configured to be placed in thermal communication with a heat-generating device, a raised sidewall to facilitate fastening the actively cooled heat-dissipation lid to the printed circuit board or processor assembly, thereby defining a device chamber for the heat-generating devices on the printed circuit board to reside. A second raised sidewall extends from the opposite surface of the first plate to join with a second plate in a spaced relation to the first plate. The opposite surface of the first plate, the second raised sidewall and the second plate together define a fluid chamber that is adjacent to the device chamber. The fluid chamber is fluidly independent from the adjacent device chamber to prevent any cooling fluid flowing through the fluid chamber from entering the adjacent device chamber.

An inlet conduit in fluid communication with the fluid chamber is configured to admit coolant fluid from a pressurized source to pass into the fluid chamber to absorb heat from the second surface of the first plate in thermal communication with the heat-generating device. An outlet conduit in fluid communication with the fluid chamber is configured to let coolant fluid warmed by contact with the second surface of the first plate to flow out of the fluid chamber and into a closed loop fluid-cooling system, where the coolant fluid is then re-cooled before being pumped back into the fluid chamber via the inlet conduit.

Thus, embodiments of the present invention enable more efficient removal of excess heat generated by heat-generating devices on computer processors, printed circuit boards and processor assemblies, which is necessary to support higher performance, high-powered processors.

BRIEF DESCRIPTION OF THE DRAWINGS

For a better understanding of the present disclosure, reference is made to the accompanying drawings, in which:

FIG. 5 shows of a processor assembly equipped with yet another embodiment of a heat-dissipation lid, wherein the fluid chamber is divided into two separate reservoirs separated by a third plate having a plurality of nozzles that are configured to accelerate the rate of flow of the flowing coolant as it flows out the first reservoir and into the second reservoir.

MODES FOR CARRYING OUT EXEMPLARY EMBODIMENTS

Figure 2:
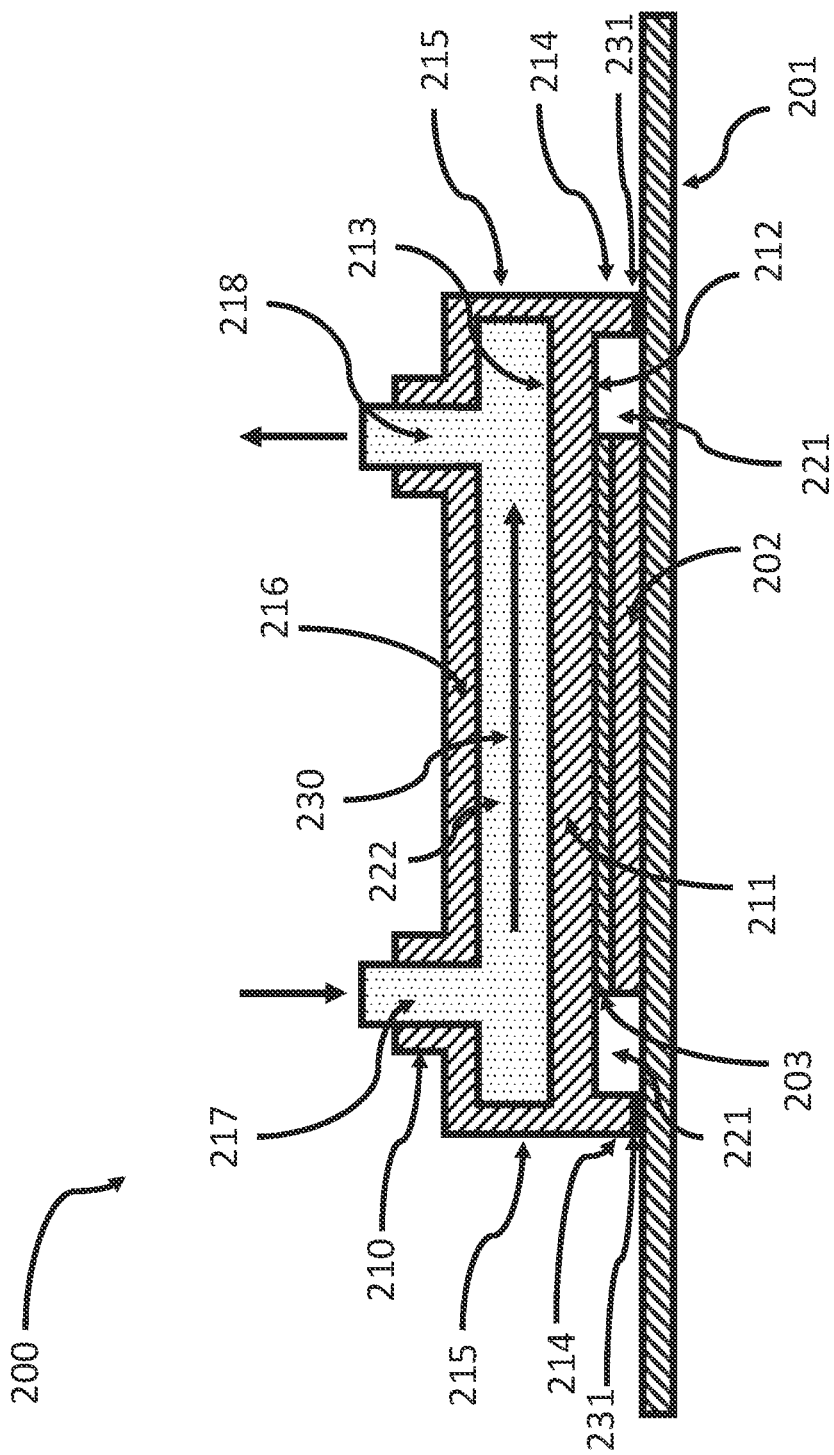
FIG. 2 shows an example of a processor assembly equipped with a heat-dissipation lid according to one embodiment of the present invention.

FIG. 2 shows an example of a processor assembly 200 equipped with a heat-dissipation lid 210 according to one embodiment of the present invention. The heat-dissipation lid 210 is installed on a printed circuit board or processor carrier 201 in order to provide more efficient cooling for a heat-generating device 202, such as a semiconductor die, which is disposed on top of the printed circuit board or processor carrier 201. In this embodiment, the heat-dissipation lid 210 comprises a first plate 211, a first surface 212 on the first plate 211, a first raised sidewall 214, a second raised sidewall 215, a second plate 216, a second surface 213 on the first plate 211, an inlet conduit 217, an outlet conduit 218, a device chamber 221 and a fluid chamber 222.

As shown in FIG. 2, a thermal interface material (TIM) 203 is placed on top of the heat-generating device 202. Then the heat-dissipation lid 210 is attached to the printed circuit board or processor carrier 201 so that the first surface 212 of the first plate 211 of the heat-dissipation lid 210 comes into direct contact with the TIM 203. The direct contact between the TIM 203 atop the heat-generating device 202 and the first surface 212 of the first plate 211 effectively places the first plate 211 in thermal communication with the heat-generating device 202 on the printed circuit board or processor carrier 201 via the TIM 203. A first raised sidewall 214 extends perpendicularly away from the first surface 212 of the first plate 211. The first raised sidewall may, or may not, span the entire perimeter of the first plate 211.

The heat-dissipation lid 210 is typically installed so that at least a portion of the first raised sidewall 214 abuts the printed circuit board or processor carrier 201 so that the first raised sidewall 214, the first surface 212 of the first plate 211 and the nearby walls of the heat-generating device 202 cooperate to define the device chamber 221, which encloses and surrounds the heat-generating device 202 and/or TIM 203. This device chamber 221 also provides various protections to the semiconductor device, for example mechanical, moisture, chemical, and/or electrostatic protection from the surrounding environment. As stated previously, the first raised sidewall 214 does not necessarily span the full perimeter of the first plate 211. In other words, there may exist through-holes or gaps (not shown in FIG. 2) in the first raised sidewall 214 such that the device chamber 221 is not completely enclosed by the first raised sidewall 214. In some embodiments, a fastener 231, comprising, for example, an epoxy, an adhesive, or other suitable material, may be used to physically attach the heat-dissipation lid 210 to the printed circuit board or processor carrier 201.

The second surface 213 of the first plate 211 is located on the opposite side of the first plate 211, i.e., opposite from first surface 212 of the first plate 211. A second raised sidewall 215 extends perpendicularly from the second surface 213. A second plate 216 is disposed on the ends of the second raised sidewall 215, opposite from the second surface 213 of the first plate 211, so that the second raised sidewall 215, the second surface 213 of the first plate 211, and the second plate 216 define the boundaries of the fluid chamber 222 configured to permit a coolant 230 to flow therethrough. The inlet conduit 217, which is disposed to be in fluid communication with the fluid chamber 222, is configured to accept pressurized coolant, and the outlet conduit 218, which is also disposed to be in fluid communication with fluid chamber 222, is configured to exhaust heated coolant from the fluid chamber 222. The inlet conduit 217 and the outlet conduit 218 are both connected to a closed loop fluid-cooling system (not shown in FIG. 2).

In operation, the heat-generating device 202 generates heat, which flows into the first plate 211 by way of the thermal interface material (TIM) 203 adjacent to the first surface 212. The heat then flows through the first plate 211 to the second surface 213. The heat-dissipation lid 210 accepts a flowing coolant 230 into its fluid chamber 222 from a pressurized source via its inlet conduit 217. When the flowing coolant 230 contacts the second surface 213 of the first plate, the flowing coolant 230 absorbs and carries heat away from the first plate 211 at the second surface 213 via convection. The heated coolant then exhausts from the fluid chamber 222 into a closed loop fluid-cooling system (not shown) via outlet conduit 218. From there, the coolant is cooled by a separate heat exchanger (e.g. chiller, cooling tower, thermosiphon, etc.) in the closed loop fluid-cooling system and pumped anew to return to the heat-dissipation lid 210.

The first plate 211 is preferably constructed from a thermally conductive material, so as to minimize the temperature loss through the first plate 211, while also providing a way for heat to spread into the larger area of the first plate 211, as compared to the relatively small surface area on top of the heat-generating device 202, for improved cooling. Such materials may commonly include metals, such as copper or aluminum. In these scenarios, a plating may be included on the metal for better corrosion resistance, adhesion, color, erosion protection, or similar. In some embodiments, nickel plating may be on metal surfaces to minimize galvanic corrosion, especially in systems of dissimilar metals. The material may also include semiconductor materials such as silicon, silicon carbide, diamond, or others, to better match the coefficient of thermal expansion of the heat-generating device 202, to allow for manufacturing at the same semiconductor foundry, to produce more intimate thermal contact, or other for other reasons. The first surface of the first plate may, or may not, comprise indents or protrusions configured to provide additional, or prescribed, spacing between the first plate and a heat-generating device.

Heat-generating device 202 may take on various forms. A common form may comprise a semiconductor die or a plurality of semiconductor dies. A plurality of semiconductor dies may be stacked vertically (3D integration), placed side-by-side (2D integration) or some hybrid thereof (2.5D integration). The dies may commonly be made from silicon, but may also be made from any suitable semiconductor, such as silicon carbide, gallium nitride, gallium arsenide, diamond, or others. The dies may generate heat uniformly or non-uniformly. The heat-generating device 202 may also be packaged, whether with exposed silicon or not, such as may be the case with application specific integrated circuits (ASICs), monolithic microwave integrated circuits (MMICs), or similar.

The TIM 203 may take on a variety of forms, with the main goal of filling air gaps between surfaces for best possible heat transmission. In general, TIMs aim to be as high as possible in thermal conductivity while maintaining suitable structural characteristics (e.g., elastic modulus, adhesion) for appropriate integration into the processor assembly. The TIM may comprise a paste, grease, gel, epoxy, adhesive, pad, solder, tape, phase change material, or any other suitable thermal interface material. Form factors such as greases or pads may provide no structural rigidity in the connection, whereas solders or adhesives may provide more. The TIM may, or may not, provide a rigid structural connection between the heat-generating device 202 and the first plate 211; the structural requirement of the TIM is designed in conjunction with the structural nature of the fastener 231 and/or with the intended integration sequence. More rigidity in the TIM connection may make for more difficult re-work should any maintenance be required.

The fastener 231 may take on any appropriate form. In the case of FIG. 2, the fastener is disposed on the end of the first raised sidewall 214 to provide a structural connection to the circuit board 201 and/or protect the heat-generating device 202 from dust or contamination, but other configurations are possible (see FIG. 9). The fastener may comprise an adhesive, solder, chemical bond, screws or bolts, a gasket, foam, or other compliant member, or other suitable fasteners. The fastener preferably would not create a fully air-tight seal so as to avoid humidity buildup or pressurization in the device chamber 221. This can be achieved with various techniques, which will be discussed in conjunction with FIG. 8.

The inlet and outlet conduits 217 and 218 may take a variety of forms. Threaded ports may be formed in the lid 210 to accommodate a variety of different threaded fluid fittings. Threaded ports may be straight or parallel thread. Fittings may include, without limitation, push to connect fittings, barbed fittings, compression fittings, crimp fittings, or other types of fittings. Fittings may also be permanently or semi-permanently attached, whether by way of heat staking, welding (e.g., ultrasonic welding, friction stir welding, etc.), chemically bonding, or other attachment methods. Although FIG. 2 shows the inlet and outlet conduits 217 and 218 intersecting the wall of the second plate 216, it will be understood that inlet and outlet conduits 217 and 218, as well as fluid chamber 222, may alternatively be configured so that the inlet and outlet conduits 217 and 218 instead intersect the second raised sidewall 215 (or intersects both the second sidewall 215 and the second plate 216) without a loss in functionality.

Figure 9:
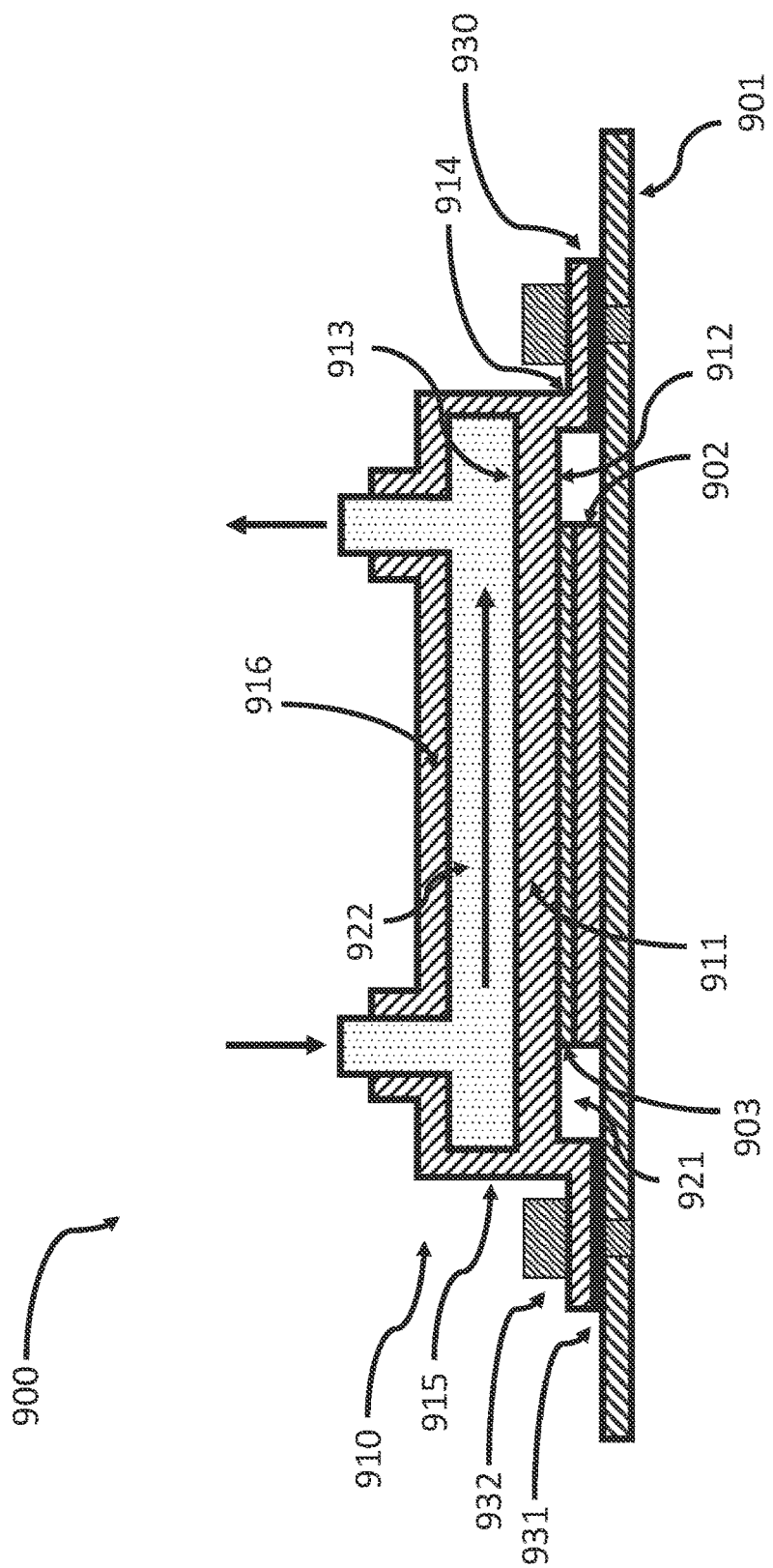
FIG. 9 shows a processor assembly equipped with a heat-dissipation lid comprising screws as a fastener.

The first raised sidewall 214 may take on different forms. As shown in FIG. 2, it may extend all the way to the printed circuit board or processor carrier 201, and it could be be attached to the printed circuit board or processor carrier 201 with a fastener 231. The height of raised sidewall 214 may be chosen so that the distance between the first surface 212 of of the first plate 211 and the printed circuit board or processor carrier 201 matches well with the thickness of the heat-generating device 202 and the desired thickness of TIM 203. In some embodiments, the first raised sidewall 214 may only extend part-way toward the printed circuit board or processor carrier 201, at which point the first surface 212 would compress onto the TIM via an applied force, potentially via a screw or similar fastener, into an existing heat-sink fastener location on the printed circuit board or processor carrier 201, as would be known to those skilled in the art. The first raised sidewall 214 may be contiguous or close to contiguous around the perimeter of the lid 210, or may have distinct sections or feet for attachment, such as, for example, at its corners or in alignment with fastener locations on the printed circuit board or processor carrier 201. The first raised sidewall 214 may contain through-holes to allow for fasteners to pass therethrough (as depicted in FIG. 9 and described in more detail below).

The coolant may take on a variety of forms. The preferred implementation may involve a single-phase liquid coolant; but may also comprise a gaseous coolant or a multiphase coolant. The coolant may comprise, for example, water, water with additives (corrosion inhibitors, biocides, antifreeze mixtures, etc.), water with glycol (e.g., propylene or ethylene glycol) in predetermined percentages (e.g., 75/25 water glycol or 50/50 water glycol mixes), oil coolants (e.g., dielectric mineral oils, dielectric synthetic oils), fluorinated compounds, ammonia, nitrogen, air, or other suitable substances.

Figure 1:
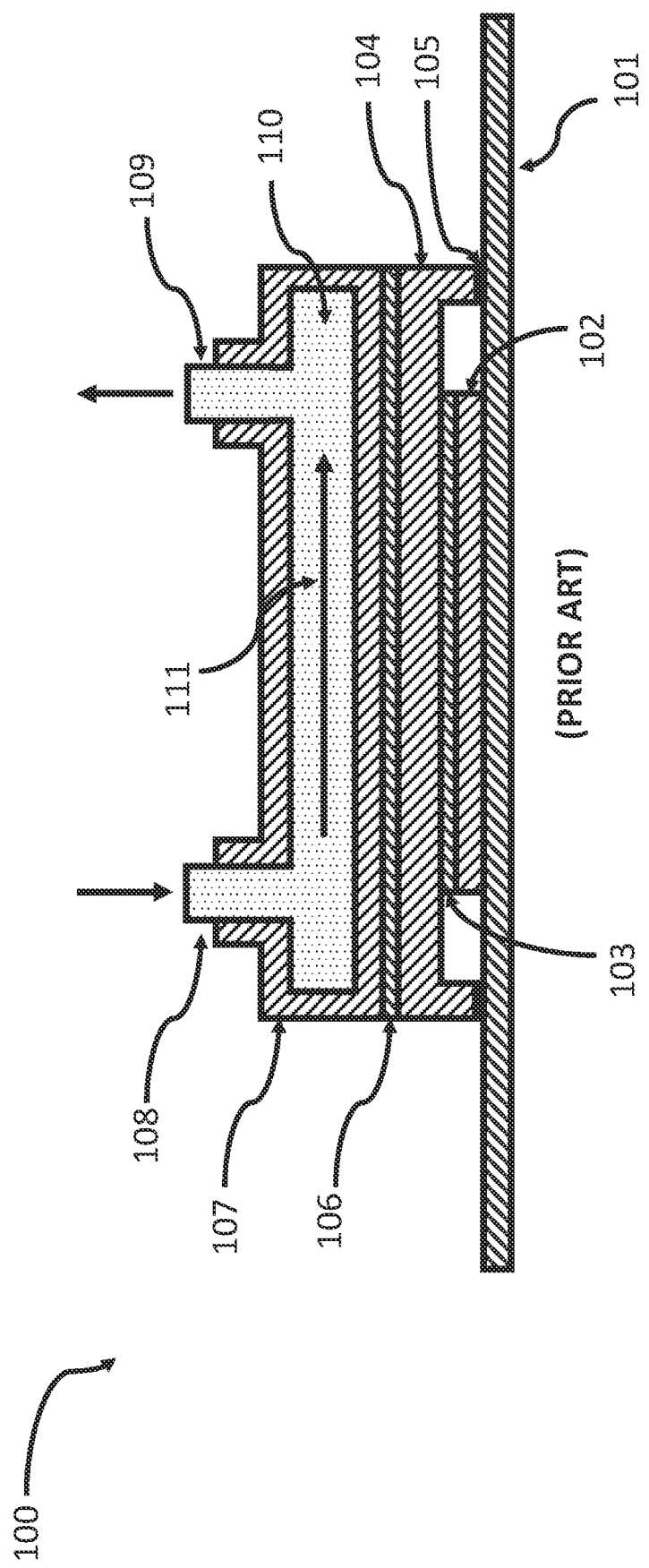
FIG. 1 shows an example of a prior art processing assembly comprising a traditional lid.

Compared to the prior art processor assembly 100 shown in FIG. 1, the processing assembly 200 shown in FIG. 2 transfers heat from the heat-generating device into the coolant much more efficiently. In the prior art processor assembly of FIG. 1, there are two thermal interface materials 103 and 106, the passive lid 104, and the heat-sink 107 through which the heat must pass before reaching the flowing coolant 111. In the processor assembly 200 of FIG. 2, the heat only has to pass through one thermal interface material 203 and one conductive body, first plate 211, to reach the flowing coolant 230. Because the first plate 211 is formed from a material with high thermal conductivity, the advantages of heat spreading to increase the cooling area remain available.

Furthermore, this configuration may also provide flexibility and be advantageous from an integration standpoint. In one configuration, the lid may be assembled at an outsourced semiconductor assembly and test (OSAT) location and minimize the installation burden on system integrators by using well-accepted assembly techniques popularized with traditional lids. Alternatively, the OSATs may choose to leave the processor unit unlidded, so that system integrators may choose and install the heat-dissipation lids 210, the TIMs and fastener(s) using their own well-accepted assembly techniques, as is typically done with traditional heat-sinks.

Convection heat transfer increases in direct proportion with an increase in the amount of surface area on the heated surface that comes into direct contact with coolant fluid flowing through the fluid chamber of the heat-dissipation lids structured in accordance with some embodiments of the present invention. Therefore, adding structural features to the inside of the fluid chamber to increase the amount of heated surface area exposed to the flow of cooling fluid will increase the rate of heat transfer in the fluid chamber, and thus, increase the rate of cooling for heat-generating device. An increase in the rate of heat transfer and the rate of cooling usually permits the heat-generating device to operate at higher power without overheating; and higher power equates to faster processing capabilities and higher computational throughput.

Figure 3:
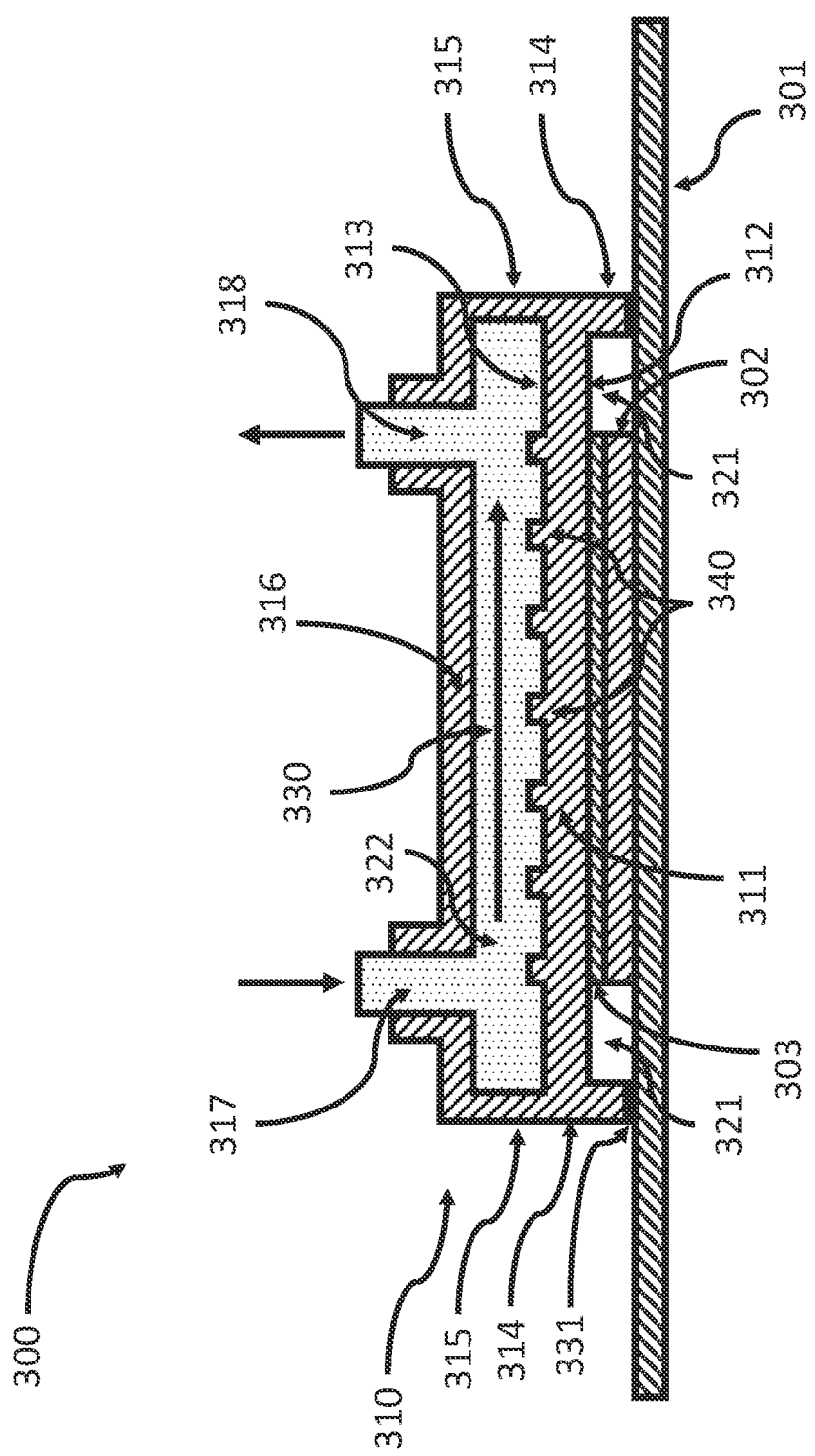
FIG. 3 shows an example of a processor assembly equipped with a heat-dissipation lid according to a second embodiment of the present invention, wherein the second surface of the first plate comprises a plurality of pin fins disposed along its length.

FIG. 3 shows an example of a processor assembly 300 equipped with a heat-dissipation lid 310 according to a second embodiment of the present invention. The structure and the principle of operation for the heat-dissipation lid 310 shown in FIG. 3 is substantially the same as the structure and principle of operation for the heat-dissipation lid 210 shown in FIG. 2, except that, in the embodiment shown in FIG. 3, the second surface 313 of the first plate 311 has a plurality of pin fins 340 disposed along its length, wherein the plurality of pin fins 340 extend partway into the fluid chamber 322. As shown in FIG. 3, each pin fin in the plurality of pin fins 340 is shaped to be structurally multifaceted, i.e., comprising a multiplicity of differently oriented faces, sides or aspects, so that when the flowing coolant 330 passes through the fluid chamber 322, the flowing coolant 322 will come into direct contact with and flow over more heated surface area (as compared to what happens when the flowing coolant 330 passes through a fluid chamber that does not have the pin fins 340) and is thereby able to absorb and remove more heat from the second surface. Although FIG. 3 depicts an embodiment in which the surface area enhancement comprises a plurality of substantially rectilinear pin fins 340, it will be recognized and appreciated by those familiar with the art, that a variety of other types of surface area enhancement features may be employed to increase the amount of heated surface area exposed to the coolant fluid, including without limitation, surface roughening, skived fins, circular pillars, or other such features. These features can also serve to direct the flow to ensure flow traverses the desired portion of the fluid chamber 322. For example, they can preferentially direct flow to areas that would otherwise be stagnant, whereby lower heat transfer properties would be reached if the flow manipulating features were not present.

In accordance with the embodiment shown in FIG. 3, a heat-generating device 302, such as a semiconductor die, is disposed on a printed circuit board or processor carrier 301. The heat-dissipation lid 310 comprises a first plate 311 having a first surface 312. The first surface 312 of the first plate 311 is placed in thermal communication with the device 302 via a thermal interface material (TIM) 303. A first raised sidewall 314 extends perpendicularly away from the first surface 312 of the first plate 311 to abut the top of the printed circuit board or processor carrier 301. This first raised sidewall 314 defines one wall of a device chamber 321 surrounding and enclosing the heat-generating device 302 and/or TIM 303. A fastener 331 may be used to affix the heat-dissipation lid 310 to the printed circuit board or processor carrier 301.

There is a second surface 313 located on the opposite side of first plate 311, i.e., opposite from the side comprising the first surface 312. A second raised sidewall 315 extends perpendicularly from the second surface 313 to help define a perimeter wall of a fluid chamber 322. A second plate 316 is disposed on the ends of the second raised sidewall 315, opposite from the second surface 313, so that the second surface 313, the second raised sidewall 315 and the second plate 316 cooperate to define a fluid chamber 322 configured to permit flowing coolant 330 to pass therethrough. An inlet conduit 317 in fluid communication with the fluid chamber 322 is configured to accept a pressurized coolant. An outlet conduit 318, which is also in fluid communication with fluid chamber 322, is configured to exhaust heated coolant from the fluid chamber 322 to an open or closed loop fluid-cooling system (not shown in FIG. 3).

Figure 4:
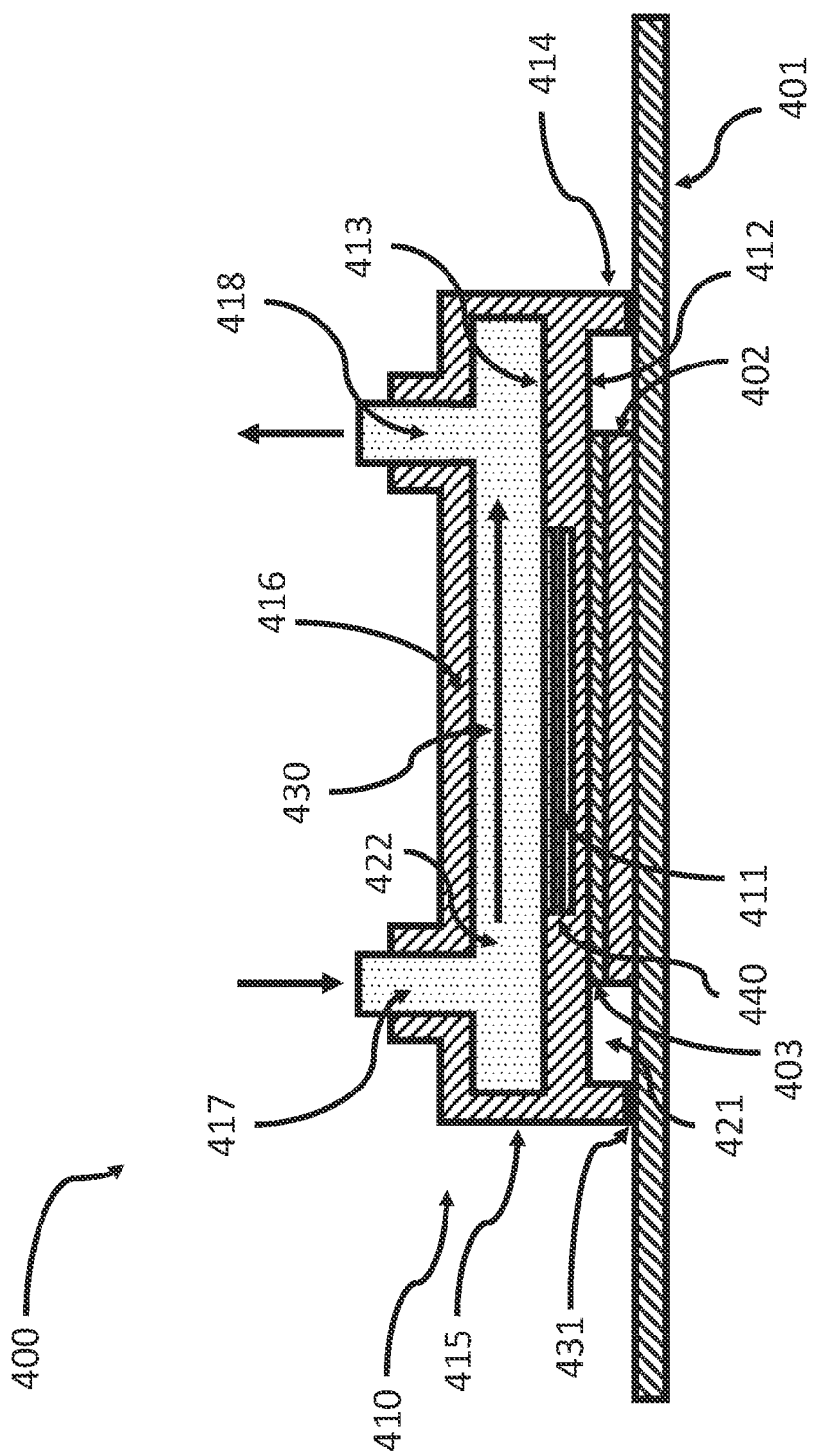
FIG. 4 shows a processing assembly equipped with a heat-dissipation lid structured according to still another embodiment of the present invention, wherein the second surface of the first place includes one or more flow channels.

FIG. 4 shows a processing assembly 400 equipped with a heat-dissipation lid 410 structured according to still another embodiment of the present invention. In this embodiment, the second surface 413 of the first plate 411 comprises one or more flow channels 440. Because convection heat transfer improves as the flow passage characteristic length scale decreases, providing one or more smaller flow channels through which fluid can flow improves the cooling flux. In certain cases, the one or more flow channels 440 may also increase the amount of heated surface area the cooling fluid 430 contacts, improving heat transfer as described above in connection with FIG. 3. The one or more flow channels 440 may be embedded below the second surface 413 of the first plate 411 (as is depicted in FIG. 4). However, the one or more flow channels 440 also may protrude above second surface 413, as may be appropriate for the selected manufacturing technique or desired flow profile. These flow channels 440 may take on any appropriate form, and the various designs and geometries of the flow channels 440 may vary the number of channels, the passageway hydraulic diameters, the passageway lengths, etc., based, for example, on the available pressure drop and heat transfer rate required. Notably, the one or more flow channels 440 also may be formed from skiving, etching, traditional machining, or any other suitable manufacturing technique.

As shown in FIG. 4, a heat generating device 402, such as a semiconductor die, is disposed on a printed circuit board or processor carrier 401. The heat-dissipation lid 410 comprises a first plate 411. The first plate 411 is placed in thermal communication with the device 402 via a thermal interface material (TIM) 403. A first raised sidewall 414 extends perpendicularly away from the first surface 412 of the first plate 411. The connection of the first raised sidewall 414 to the first surface 412 defines a device chamber 421 with sufficient space for the device 402 and/or TIM 403 to reside. There may be a fastener 431 that connects the heat-dissipation lid 410 to the circuit board or processor carrier 401. There is a second surface 413 of the first plate 411, located opposite first surface 412. A second raised sidewall 415 extends perpendicularly from the second surface 413 to form a fluid chamber 422. A second plate 416 is disposed on the ends of the second raised sidewalls 415 to create a fluid tight fluid chamber configured to prevent any of the flowing coolant 430 from entering the device chamber 421. An inlet conduit 417 is disposed to be in fluid communication with the fluid chamber 422, configured to accept a pressurized coolant. An outlet conduit 418 is also disposed to be in fluid communication with fluid chamber 422 and configured to exhaust heated coolant from the fluid chamber to a closed loop fluid cooling system.

FIG. 5 shows of a processor assembly 500 equipped with yet another embodiment of a heat-dissipation lid 500. In this embodiment, the heat-dissipation lid 510 is substantially the same in structure as the heat-dissipation lids 210 and 310 shown in FIGS. 2 and 3, respectively, except that the fluid chamber 522 is divided into two separate reservoirs separated by a third plate 540 having a plurality of nozzles 543 that are configured to accelerate the rate of flow of the flowing coolant 530 as it flows out the first reservoir and into the second reservoir.

More specifically, a third plate 540 is disposed between the first plate 511 and the second plate 516 and is spaced apart from both the first plate 511 and the second plate 516, so that the third plate 540 effectively divides the fluid chamber 522 into two fluid reservoirs, namely a fluid-distribution reservoir 541 and a fluid-collection reservoir 542. The second surface 513 of the first plate 511 defines a boundary (i.e., a wall) of the fluid collection reservoir 542. A plurality of nozzles 543 are disposed in the third plate 540. These nozzles 543 act as fluid conduits to permit coolant fluid to flow out of the fluid-distribution reservoir 541 and into the fluid-collection reservoir 542. The nozzles 543 are sized and configured to increase the velocity of the flowing coolant 530 and direct the flowing coolant 530 to strike (impinge on) the heated second surface 513 of the first plate 511 inside the fluid-collection reservoir. The higher velocity flow of the flowing coolant 530 and impingement on the heated second surface 513 in the fluid-collection reservoir 542 increases the cooling rate of the heated second surface 513. Preferably, the nozzles 543 are suitably arranged in terms of their proximity to the heat-generating device 502 so that the highest cooling flux occurs at the hottest areas on the heated second surface 513 of the first plate 511. For example, the nozzles may be spatially located such that they are aligned with specific circuits or hot spots on the semiconductor device.

As shown in FIG. 5, a heat generating device 502, such as a semiconductor die, is disposed on a printed circuit board or processor carrier 501. The heat-dissipation lid 510 comprises a first plate 511. The first plate 511 is placed in thermal communication with the heat-generating device 502 via a thermal interface material (TIM) 503. A first raised sidewall 514 extends perpendicularly away from the first surface 512 of the first plate 511. The connection of the first raised sidewall 514 to the first surface 512 defines a device chamber 521 with sufficient space for the heat-generating device 502 and/or TIM 503 to reside. There may be a fastener 531 that connects the heat-dissipation lid 510 to the circuit board or processor carrier 501. There is a second surface 513 of the first plate 511, located opposite first surface 512. A second raised sidewall 515 extends perpendicularly from the second surface 513 to form a fluid chamber 522. Sidewall 515 may thereby be configured to prescribe a certain height of fluid collection reservoir 542. A second plate 516 is disposed on the ends of the second raised sidewalls 515 to create a fluid tight fluid chamber configured to prevent any of the flowing coolant 530 from entering the device chamber 521. An inlet conduit 517 is disposed to be in fluid communication with the fluid chamber 522, configured to accept a pressurized coolant. An outlet conduit 518 is also disposed to be in fluid communication with fluid chamber 522 and configured to exhaust heated coolant from the fluid chamber to a closed loop fluid cooling system.

In operation, the heat-generating device 502 generates heat, which flows into the first plate 511 by way of thermal interface material 203 at first surface 512, conducting to the second surface 513 to be removed by the flow of the flowing coolant 530. The heat-dissipation lid 510 admits flowing coolant 530 into the fluid distribution reservoir 541 of its fluid chamber 522 from a pressurized source via its inlet conduit 517. The flowing coolant 530 passes through nozzles 543 of the third plate 540 and into the fluid-collection reservoir 542 to remove heat from the second surface 513 of first plate 511 via convection. The now-heated flowing coolant 530 then exits the fluid collection reservoir 542 via outlet conduit 518 of fluid chamber 522 to pass into a closed loop fluid-cooling system. From there, the flowing coolant 530 may be cooled by a separate heat exchanger, e.g., chiller, cooling tower, thermosiphon, etc. (not shown in FIG. 5) and is then returned to the heat-dissipation lid 510 through the inlet conduit 517.

The nozzles 543 may be implemented in a variety of different forms and designs, including any suitable form or design that has the effect of accelerating the flowing coolant 530 to effectively create coolant "jets," which impinge onto the heated second surface 513 of the first plate 511. Thus, the nozzles 543 may be implemented using any suitable cross section shape, which could be circular, triangular, square, slotted, or any other suitable shape. Although the example shown in FIG. 5 depicts the lid 510 as having a plurality of nozzles 543 in the third plate 540, it will be recognized and appreciated that a different embodiment may have only a single nozzle passing through the third plate 540 and still be effective at sufficiently accelerating the flowing coolant 530 as it passes from the fluid-distribution reservoir 541 to the fluid-collection reservoir 542. When there are a plurality of nozzles 543, they may be arranged uniformly in an array, or they may be more densely packed in certain regions across the length and width of the third plate 540. This arrangement may be more effective at cooling hot spots or areas of relatively higher heat generation because a higher concentration of nozzles 543 may deliver more coolant, and thereby increase the cooling flux in those hotspots. Each nozzle may be the same or different diameter, shape, or spacing from each other nozzle.

Figure 6B:
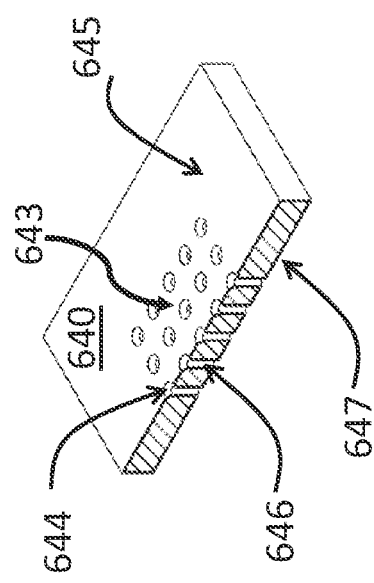
FIG. 6B shows a cross sectioned view of the third plate of FIG. 6A, wherein the cross section "cut" is taken along the line 6B-6B of the third plate in FIG. 6A, thereby bisecting all the nozzles in one row of the array of nozzles.
Figure 6A:
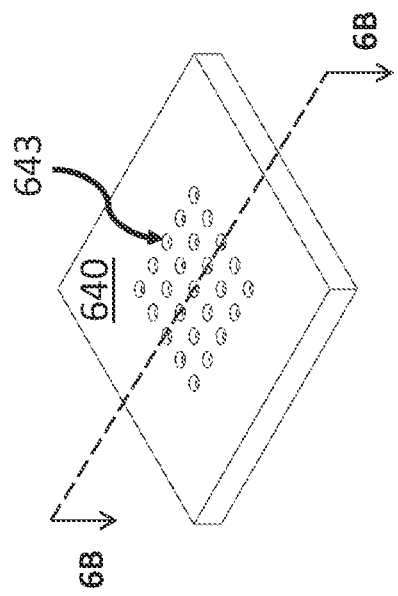
FIG. 6A shows an isometric view of an exemplary third plate that might be disposed inside the fluid chamber of the heat-dissipation lid shown in FIG. 5.

The plurality of nozzles 543 may have a uniform profile throughout their length, as depicted in FIG. 5. Alternatively, as shown in FIGS. 6A and 6B, some or all the nozzles may have nonuniform profiles (e.g., nonuniform diameters) throughout their length. For instance, FIG. 6A shows an isometric view of an exemplary third plate 640 that might be disposed inside the fluid chamber 522 of the heat-dissipation lid 510 shown in FIG. 5. As shown in FIG. 6A, third plate 640 contains an array of nozzles 643. FIG. 6B shows a cross sectioned view of the third plate 640 of FIG. 6A, wherein the cross section "cut" is taken along the line 6B-6B of the third plate 640 in FIG. 6A, thereby bisecting all the nozzles in one row of the array of nozzles 643. The cut reveals that each one of the bisected nozzles has a first diameter 644 on the fluid-distribution reservoir side 645 of the third plate 640, and a second diameter 646 on the fluid-collection reservoir side 647 of the third plate 640, wherein the first diameter 644 is greater than the second diameter 646. This configuration typically reduces the drop in pressure that would otherwise occur as the flowing coolant 530 passes through the third plate 640, without appreciably impacting thermal performance. The first diameter 644 at the inlet-facing side 645 of the third plate 640 may be suitably implemented in a variety of different profiles, including without limitation, a simple taper, a chamfer, a rounded edge, or the like.

Figure 7B:
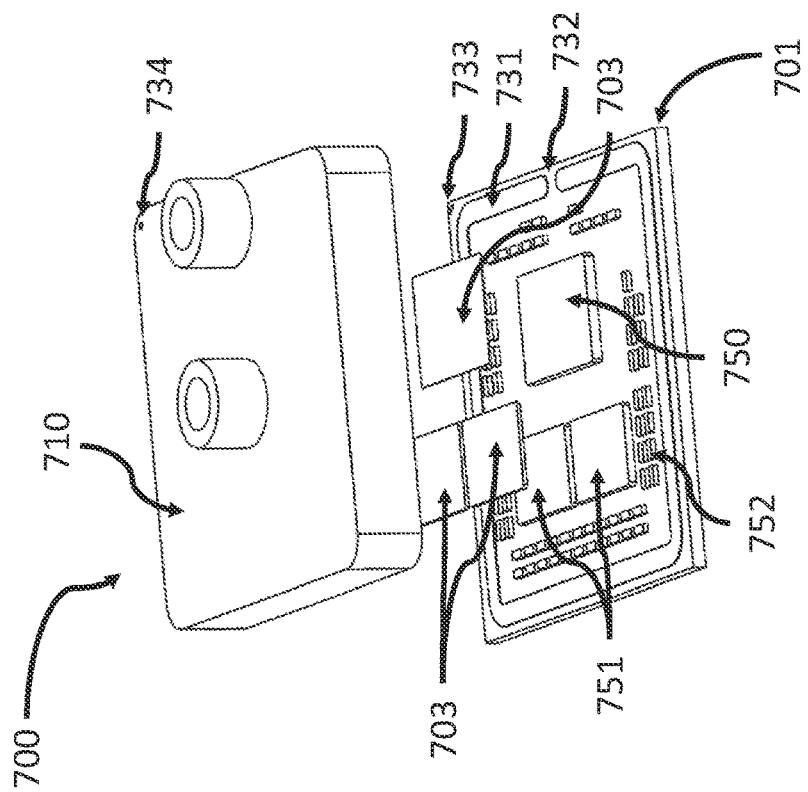
FIG. 7B shows an exploded view of the processor assembly shown in FIG. 7A, thereby revealing some of the interior components of the processor assembly.
Figure 7A:
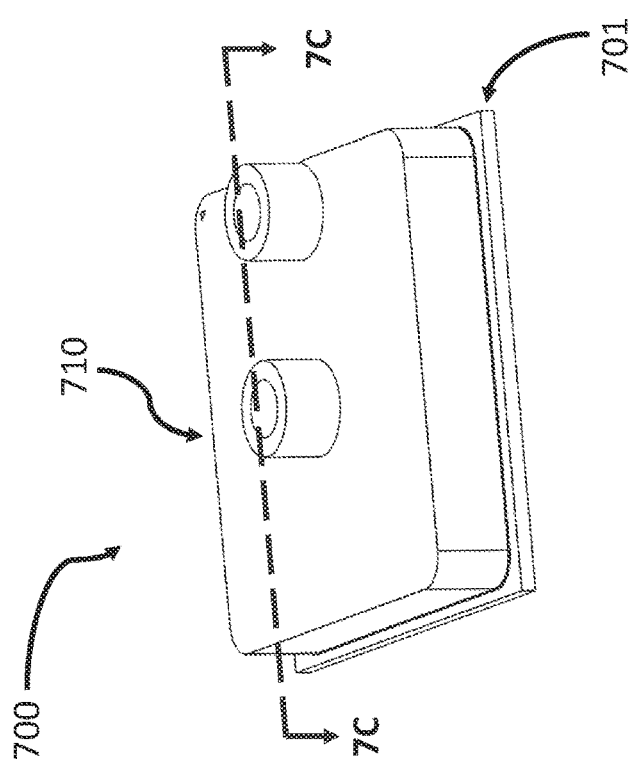
FIG. 7A shows an isometric view of a processor assembly equipped with a heat-dissipation lid 710 constructed in accordance with yet another embodiment of the present invention.

FIG. 7A shows an isometric view of a processor assembly equipped with a heat-dissipation lid 710 constructed in accordance with yet another embodiment of the present invention. FIG. 7B shows an exploded view of the processor assembly 700 of FIG. 7B, thereby revealing some of the interior components of the processor assembly 700. As shown best in FIG. 7B, the processor assembly 700 comprises a primary heat-generating device 750 and a pair of secondary heat-generating devices 751 disposed on the printed circuit board 701. As will be seen with better clarity in FIG. 7C, the primary heat-generating device 750 is thicker than the secondary heat-generating devices 751, and therefore has a relatively higher height (as measured from the plane of the printed circuit board 701) than the secondary heat-generating devices 751. Disposed on the primary and secondary heat-generating devices 750 and 751 are thermal interface material layers 703 to provide thermal communication to the heat-dissipation lid 710.

A fastener 731 is disposed in this view on the printed circuit board 701, but in administration also may be disposed on the heat-dissipation lid 710. In this embodiment, the fastener 731 may be an adhesive layer for affixing the heat-dissipation lid 710 onto the printed circuit board 701. There is a gap 732 in the fastener 731 to provide a vent into the chamber in which the primary and secondary heat-generating devices 750 and 751 sit, so as to avoid humidity buildup or pressurization when the devices are turned on, for example, from any outgassing that may occur in the thermal interface materials 703. A registration feature 733, common to processor carriers, is aligned with a corresponding registration feature 734 on the heat-dissipation lid 710, to allow for appropriate orientation of the heat-dissipation lid 710 when being fastened to the printed circuit board 701, especially in scenarios with nonsymmetric heat-generating device layouts. There are other components 752 disposed on the printed circuit board 701 which are not placed in thermal communication with the heat-dissipation lid 710 (see FIG. 7C). Typically, these other components 753 are low-power components, such as capacitors, for example, whose heat is adequately managed via conduction into the circuit board 701, and therefore do not require the active cooling of the heat-dissipating lid 710.

Figure 7C:
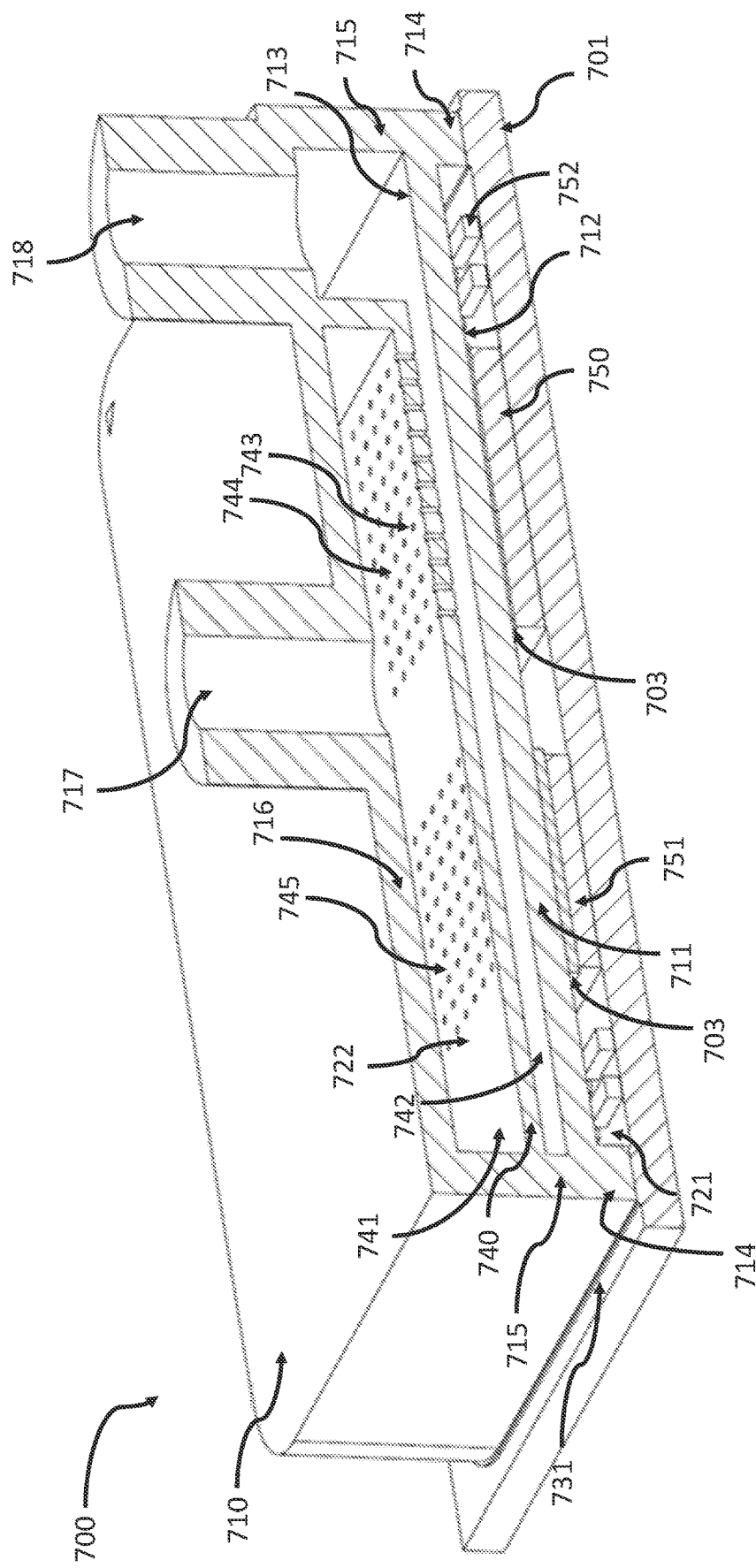
FIG. 7C shows an isometric cross-sectional view of the processing assembly, cut along the line 7C-7C of FIG. 7A.

FIG. 7C shows an isometric cross-sectional view of the processing assembly 700, cut along the line 7C-7C of FIG. 7A. As shown in FIG. 7C, the heat-dissipation lid 710 comprises a first plate 711. The first plate 711 is placed in thermal communication with the primary heat-generating device 750 and the secondary heat-generating devices 751 via a thermal interface material (TIM) 703. The first plate 711 has a flat first surface 712 that is in direct contact with the TIMs 703. Because the primary heat-generating device 750 is taller than the secondary heat-generating devices 751, the layer of TIM 703 located between the primary heat-generating device 750 and the first plate 711 is thinner than the layer of TIM 703 located between the secondary heat-generating devices 751 and the first plate 711. It is anticipated that, so long as the layer of TIM 703 is applied properly, that primary heat-generating device 750 will more efficiently transfer heat into the first plate 711, as conduction losses occur when going through thicker TIMs. Nonetheless, both the primary and the secondary heat-generating devices 750 and 751 are in thermal communication with first plate 711 via the TIMs 703 for heat removal via a flowing coolant passing through the h eat-dissipation lid 710.

As shown best in FIG. 7C, a first raised sidewall 714 extends perpendicularly away from the first surface 712 of the first plate 711. This first raised sidewall 714, in combination with the first surface 712, helps to create a device chamber 721 in which the primary and secondary heat-generating devices 750 and 751 and/or TIM 703 reside. A fastener 731 may be provided between the first raised sidewall 714 and the circuit board 701 to fix the heat-dissipation lid 710 to the circuit board 701. A second surface 713 of the first plate 711 is located on the opposite side of the first plate, opposite from the first surface 712. A second raised sidewall 715 extends perpendicularly from the second surface 713. A second plate 716 is disposed on the ends of the second raised sidewall 715. The structure and configuration of the second surface 713, the second raised sidewall 715 and the second plate 716 define a fluid-tight fluid chamber 722 that does not permit any cooling fluid flowing through the fluid chamber 722 to reach the device chamber 721 or any of the heat-generating devices therein. An inlet conduit 717 in fluid communication with the fluid chamber 722 is configured to admit a pressurized coolant into the fluid chamber 722. An outlet conduit 718 is also in fluid communication with fluid chamber 722, and it is configured to permit heated coolant to flow out of the fluid chamber 722 and into a closed loop fluid-cooling system (not shown), which will typically include some type of heat exchanger to cool the heated coolant fluid. Typically, but not necessarily, the inlet conduit 717 is located at one end of the fluid chamber 722, while the outlet conduit 718 is at the opposite end of the fluid chamber 722, which tends to facilitate smooth and efficient flow of coolant fluid therethrough.

The heat-dissipation lid 710 in FIG. 7C further comprises a third plate 740, which serves to divide the fluid chamber 722 into two fluid reservoirs, namely a fluid distribution reservoir 741 and a fluid collection reservoir 742. A plurality of nozzles 743 are disposed in the third plate 740 to provide fluid communication between the fluid distribution reservoir 741 and the fluid collection reservoir 742. These nozzles 743 generate elevate the velocity of the flowing coolant 730 while directing the flowing coolant 730 to strike (impinge on) the heated second surface 713 of the first plate 711. The elevated velocity flow and direct impingement enhance the cooling rate of the coolant as it strikes and flows over the heated second surface 713.

Because the processor assembly 700 has multiple heat-generating devices 750 and 751, the nozzles 743 are arranged into two arrays 744 and 745 to target the areas of greatest heat transmission through the first plate 711 of the heat-dissipation lid 710. The arrays 744 and 745 comprising flow-accelerating nozzles 743 may be arranged in any suitable pattern and spacing, and such pattern and spacing may be the same or different between the two arrays 744 and 745. In one example, the array 744 may contain a greater number, and/or more densely packed nozzles, near the primary heat-generating device 750 if the primary heat-generating device 750 is higher in power or power density than the secondary heat-generating devices 751. In other situations, the array 745 may contain a greater number of nozzles, and/or more densely packed nozzles, to provide a better cooling flux, to accommodate the greater TIM thickness 703 for the secondary heat-generating devices 751, which would generate more heat than the primary heat-generating device 750, all other things equal. Other electrical components 752 are not placed in thermal communication with the heat-dissipation lid 710, and may dissipate their excess generated heat through the circuit board 701.

Figure 8B:
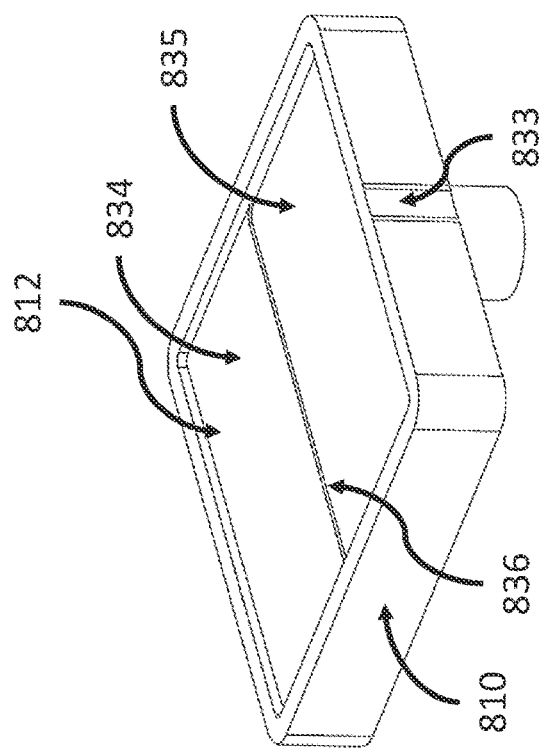
FIG. 8B shows a bottom isometric view of the heat-dissipation lid in FIG. 8A, without the printed circuit board, which reveals an alternative structure for the bottom surface of the heat-dissipation lid according to one embodiment.
Figure 8A:
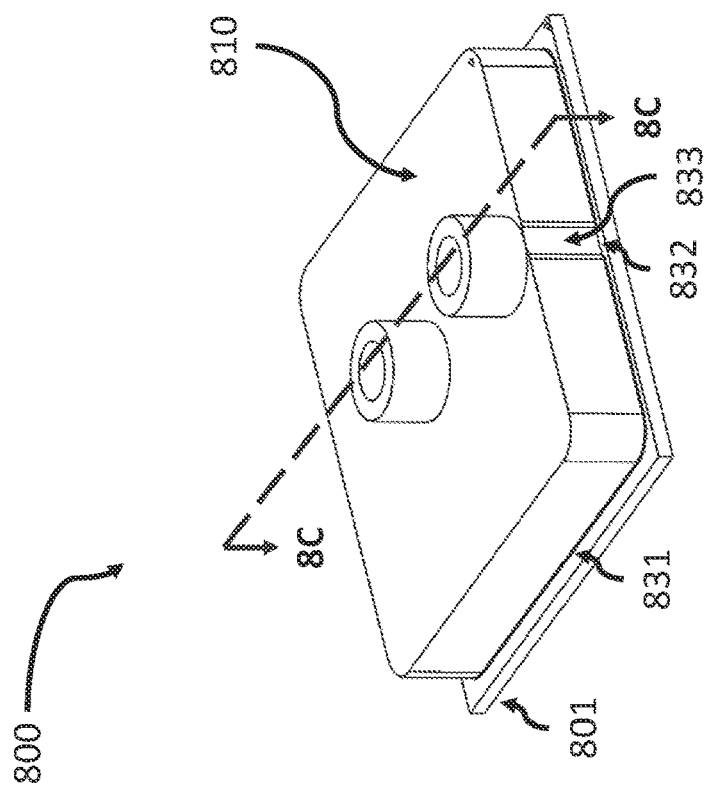
FIG. 8A shows a top isometric view of one embodiment of the heat-dissipation lid disposed on a printed circuit board.

FIGS. 8A and 8B show isometric views of a processor assembly 800 equipped with a heat-dissipation lid 810 constructed in accordance with yet another embodiment of the present invention. FIG. 8A shows a top isometric view of a heat-dissipation lid 810 disposed on a printed circuit board 801. FIG. 8B shows a bottom isometric view of the heat-dissipation lid 810 without the printed circuit board 801, which reveals an alternative structure for the bottom surface 812 of the heat-dissipation lid 810.

As indicated in FIG. 8A, a fastener 831 may be applied to the printed circuit board 801, to the sidewalls of the heat-dissipation lid 810, or both, to affix heat-dissipation lid 810 to the printed circuit board 801. The fastener 831 may comprise, for example, a layer of adhesive. In alternative embodiments, the faster 831 may comprise an epoxy, one or more screws, pins or bolts, or any other suitable fastener as is known in the art, for attaching lids (or heat spreaders) to circuit boards. In this embodiment, and as shown in FIGS. 8A and 8B, there is a notch 833 in one or more of the sidewalls of the heat-dissipation lid 810, each notch 833 having a corresponding gap 832 in the fastener 831. Together, the notch 833 and the gap 832 provide a vent into the device chamber where the heat-generating devices sit, so as to avoid humidity buildup or pressurization in the device chamber from any outgassing that may occur in the thermal interface materials, for example, when the devices are turned on.

As shown in FIG. 8B, a step 836 splits the bottom surface 812 of the first plate 811 of the heat-dissipation lid 810 into two sub-surfaces 834 and 835 of uneven heights. The uneven heights of sub-surfaces 834 and 835 help maintain a more uniform or preferable thermal interface material thickness for heat-generating devices that may be of different heights, compared to that of a planar surface (see, for example, first surface 712 shown in FIG. 7). The sub-surfaces 834 and 835 of the bottom surface 812 of the first plate 811 of the heat-dissipation lid 810 are shown in more detail in FIG. 8C.

Figure 8C:
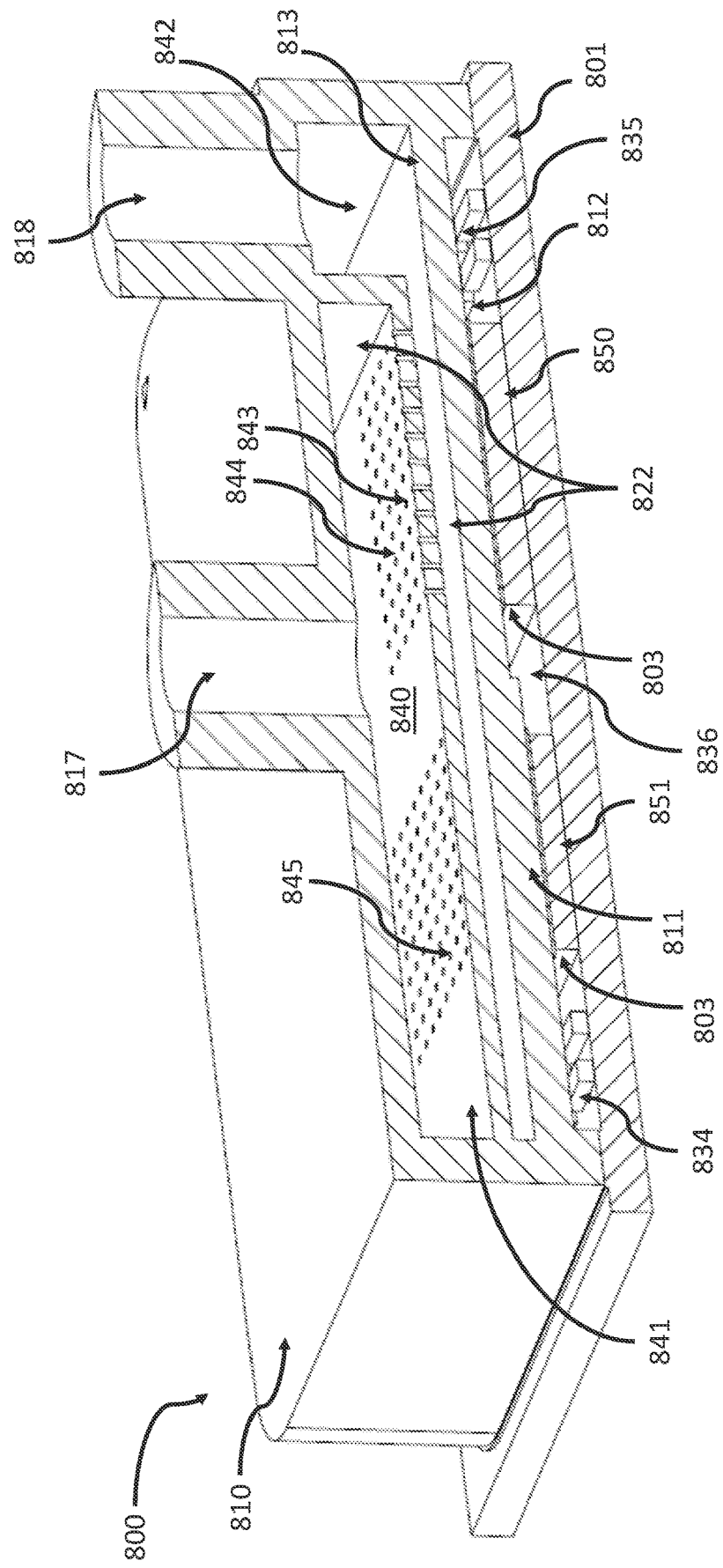
FIG. 8C shows an isometric cross section of the heat-dissipation lid, wherein the "cut" of the sections is taken along line 8C-8C in FIG. 8A.

FIG. 8C shows an isometric cross section of the heat-dissipation lid 810, wherein the "cut" of the sections is taken along line 8C-8C in FIG. 8A. A primary heat-generating device 850 and a secondary heat-generating device 851 are disposed on a printed circuit board or processor carrier 801. The heat-dissipation lid 810 comprises a first plate 811. The first plate 811 is placed in thermal communication with the primary heat-generating device 850 and the secondary heat-generating device 851 via a thermal interface material (TIM) 803. In this embodiment, as shown in FIG. 8B, the first plate 811 has a non-planar first surface 812 in contact with TIMs 803. A step 836 in the first surface 812 creates two sub-surfaces 834 and 835 at different heights above the printed circuit board 801. Therefore, even though the primary heat-generating device 850 is taller than the secondary heat-generating device 851, the TIM 803 adjacent to the primary heat-generating device 850 has substantially the same thickness as the TIM 803 adjacent to the secondary heat-generating device 851. In this case, the heat transfer into first plate 811 by the primary heat-generating device 850 through TIM 803 may have substantially the same transfer efficiency as the heat transfer in the first plate 811 by the secondary heat-generating device 851 through TIM 803. The primary and secondary heat-generating devices 850 and 851 have their heat removed via a flowing coolant passing through the heat-dissipation lid 810. The number of sub-surfaces may not be limited to only two, as multiple sub-surfaces may be beneficial depending on the construction of the semiconductor device being cooled.

The heat-dissipation lid 810 in FIG. 8C further comprises a third plate 840, which serves to divide the fluid chamber 822 into two fluid reservoirs, namely a fluid distribution reservoir 841 and a fluid collection reservoir 842. A plurality of flow accelerating nozzles 843 are disposed in the third plate 840 to facilitate heat transfer through first plate 811 via second surface 813. These nozzles 843 are configured to generate an elevated velocity flow directly towards the second surface 813 of the first plate 811 to enhance the cooling rate of the coolant against the heated second surface 813 of the first plate 811. The nozzles 843 are arranged into two arrays 844 and 845 to target the areas of greatest heat transmission through the first plate 811 of the heat-dissipation lid 810. The arrays 844 and 845 comprising the nozzles 843 may be arranged in any appropriate pattern or spacing to achieve the targeted cooling. For example, the array 844 may comprise a greater number of nozzles 843, and/or more densely packed flow accelerating nozzles 843, than array

845 if the primary heat-generating device 850 is higher in power or power density than the secondary heat-generating device 851, or vice versa. With the TIM 803 thicknesses being substantially the same between the primary and secondary heat-generating devices 850 and 851, the arrays 844 and 845 and nozzles 843 may not need individual customization. Other electrical components 852 may not need to be placed in thermal communication with the heat-dissipation lid 810 if the heat generated by those other electrical components 852 may be sufficiently dissipated through the circuit board 801.

The height of step 836, or said another way, the difference in heights from the PCB 801 of sub-surfaces 834 and 835 of first surface 812, may be of any appropriate dimension. In some cases, heat-generating devices comprising stacked DRAM chips may be of substantially greater in height than heat-generating devices comprising a chiplet or I/O die. The difference in height may be 0.1-0.5 mm, or even up to 1.0 mm, for example. The TIMs 803, even if designed to nominally incorporate the difference in heights of heat-generating devices 850 and 851, may not be the same thickness, due to variation in the manufacturing of the heat-dissipation lid 810 and/or differences in the way the dies or devices were attached to the circuit board 801. However, with common TIM thicknesses on the order of 0.01-0.1 mm, for example, adding the step 836 can have a substantial impact on the thickness of TIM 803 and greatly increase the efficiency of heat transfer by maintaining thinner conduction pathways through interface materials.

FIGS. 5-8 depict embodiments of the present invention comprising flow accelerating nozzles, which is used to achieve a form of jet impingement cooling. Jet impingement cooling operates on the principle of passing coolant fluid through small nozzles to accelerate the flow of the cooling, and thereby generate continuous "jets" of coolant fluid in a concentrated direction. Thus, after passing through the nozzles, the coolant fluid may be flowing at rates in the range of 1-25 m/s, for example, as compared to rates in the range of 0.1-2.5 m/s, for example, before passing through the nozzles. When impinging on a heated surface, especially in a substantially perpendicular orientation, these concentrated jets of coolant act to provide enhanced convection heat transfer. This occurs due to a phenomenon known as boundary layer suppression, where the momentum of the accelerated coolant causes the chilled coolant fluid to be in intimate, close contact with the heated surface, which corresponds to high heat removal capability. Boundary layer suppression allows for single phase heat transfer that can meet or exceed that of more complex multi-phase fluid cooling approaches.

In other embodiments with jet impingement cooling, there may be features (e.g., pin fins 340, as depicted in FIG. 3) disposed on the impingement surface to further increase the heat-transfer. Such heat transfer enhancement features may be disposed directly underneath the nozzles, to generate additional area for convection at the point of highest convective cooling flux. Alternatively, heat-transfer enhancement features may be disposed outside of the impingement zone (i.e., the area directly underneath the nozzles), to generate additional area for convection after the jets of cooling fluid impinge on the heated surface and turn outward to begin their exhaust flow path to the outlet conduit. The heat-transfer enhancement features may extend partially into the fluid chamber. In some embodiments, the heat-transfer enhancement features may extend all the way up to the plate comprising the nozzles (i.e., the nozzle plate). In the case where the heat-transfer enhancing features extend up to the nozzle plate, they may serve multiple functions, such as for increasing heat transfer and providing structural integrity to the nozzle plate due to the pressure drop the fluid experiences passing through the nozzles. For example, the fluid pressure between the fluid distribution reservoir and the fluid collection reservoir may produce deformation in the third plate 840 which has undesirable effects. Heat-transfer enhancing features that extend up to the nozzle plate (or third plate) may serve to provide structural support to the nozzle plate and preserve the desired height of the fluid collection reservoir.

FIG. 9 shows a processor assembly 900 equipped with a heat-dissipation lid 910 comprising screws 932 as a fastener. As shown in FIG. 9, a heat-generating device 902, such as a semiconductor die, is disposed on a printed circuit board or processor carrier 901. The heat-dissipation lid 910 comprises a first plate 911. The first plate 911 is placed in thermal communication with the heat-generating device 902 via a thermal interface material (TIM) 903. A first raised sidewall 914 extends perpendicularly away from the first surface 912 of the first plate 911. The structures and orientations of the first surface 912 and the first raised sidewall 914 defines a device chamber 921 having enough space for the heat-generating device 902 and/or TIM 903 to reside. There is a second surface 913 of the first plate 911, located opposite first surface 912. A second raised sidewall 915 extends perpendicularly from the second surface 913, so that the second raised sidewall 915 and the second surface 913 together define a fluid chamber 922. A second plate 916 is disposed on the ends of the second raised sidewalls 915 to create a fluid tight assembly to prevent a coolant flowing through the fluid chamber 922 from entering into the device chamber 921.

In this embodiment, there is a flange 930 disposed on the ends of the raised sidewalls 914. A screw 932 passes through the flange to fasten the heat-dissipation lid 910 to the circuit board 901. There may be a pad 931 placed between the flange 930 and the board 901. Unlike embodiments that use an adhesive-based fastener, using the screw 932 provides a mechanical connection between the heat-dissipation lid 910 and the circuit board 901, and may therefore serve as a more reversible attachment mechanism because the screws may be untightened to remove the lid 910, whereas an adhesive-based fastener may make the connection substantially permanent.

The screws 932 may have springs attached to them, to control the force application (e.g., avoid overtightening). The flange 930 may surround the entire heat-dissipation lid 910 or may only protrude in the area adjacent to the fastener locations on the circuit board 901 to provide stable and reliable attachment points while using a smaller amount of construction material. The pad 931, which may comprise an elastomeric material, may serve a variety of different purposes, including without limitation filling excess space caused by manufacturing variability, controlling the force of application, providing insulation to avoid short circuits, accommodating or addressing component height differences, or any combination thereof. The pad 931 may not be necessary in certain embodiments, in which there may be a gap between the flange 930 and/or the raised sidewall 914 and the printed board 901. Washers or other similar hardware may be used in conjunction with the screws 932 and/or pads 931.

Figure 10:
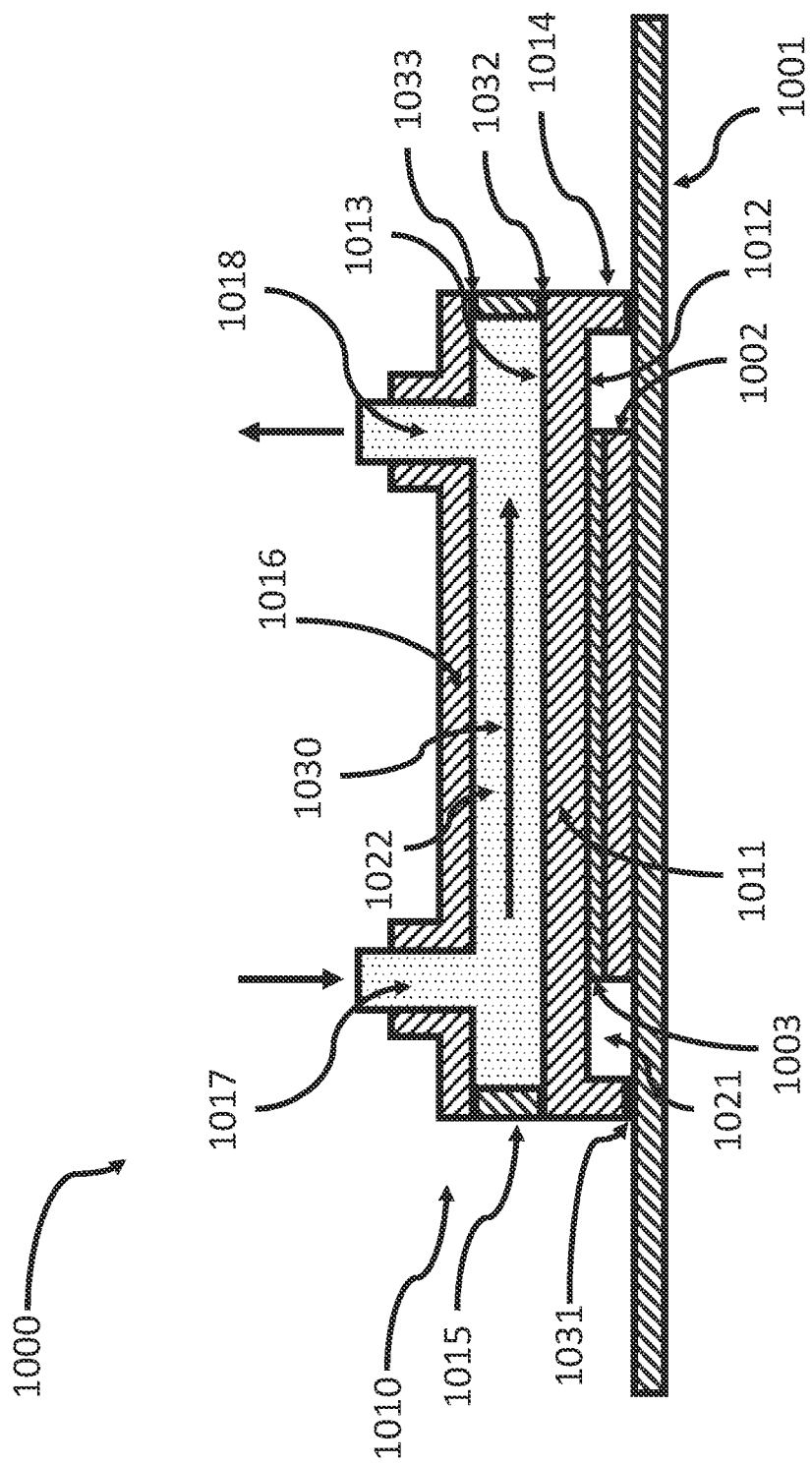
FIG. 10 shows a processor assembly equipped with a heat-dissipation lid constructed according to yet another embodiment of the present invention, wherein the heat-dissipation lid is formed by joining multiple pieces of construction material together, as opposed to being formed out of a single piece of construction material.

FIG. 10 shows a processor assembly 1000 equipped with a heat-dissipation lid 1010 constructed according to yet another embodiment of the present invention. In this embodiment, and as will be described in more detail below, the heat-dissipation lid 1010 is formed by joining multiple pieces of construction material together as described herein, as opposed to being formed out of a single piece of construction material.

As shown in FIG. 10, a heat generating device 1002, such as a semiconductor die, is disposed on a printed circuit board or processor carrier 1001. The heat-dissipation lid 1010 comprises a first plate 1011. The first plate 1011 is placed in thermal communication with the heat-generating device 1002 via a thermal interface material (TIM) 1003. A first raised sidewall 1014 extends perpendicularly away from the first surface 1012 of the first plate 1011. The connection of the first raised sidewall 1014 to the first surface 1012 defines a device chamber 1021 with sufficient space for the heat-generating device 1002 and/or TIM 1003 to reside. There may be a fastener 1031 that connects the heat-dissipation lid 1010 to the circuit board or processor carrier 1001. There is a second surface 1013 of the first plate 1011, located opposite first surface 1012. A second raised sidewall 1015 extends perpendicularly from the second surface 1013 to form a fluid chamber 1022. A second plate 1016 is disposed on the ends of the second raised sidewalls 1015 to create a fluid tight fluid chamber configured to prevent any of the flowing coolant 1030 from entering the device chamber 1021. An inlet conduit 1017 is disposed to be in fluid communication with the fluid chamber 1022, configured to accept a pressurized coolant. An outlet conduit 1018 is also disposed to be in fluid communication with fluid chamber 1022 and configured to exhaust heated coolant from the fluid chamber to a closed loop fluid cooling system.

In this embodiment, the first plate 1011 with first raised sidewall 1014, the second plate 1016, and the second raised sidewall 1015 are formed from different components and joined together. The attachment between first plate 1011 and second raised sidewall 1015 is shown by connection joint 1032. The attachment between second raised sidewall 1015 and second plate 1016 is shown by connection joint 1033. In other embodiments, joint 1032 may not exist wherein the raised sidewall 1015 and first plate 1011 and raised sidewall 1014 are formed from a unitary structure. Similarly, in yet another embodiment, connection joint 1033 may not exist, so that the raised sidewall 1015 and second plate 1016 are formed from a unitary structure. Other configurations are possible; the number of components forming the heat-dissipation lid 1010 be based, for example, on consideration of available manufacturing and assembly techniques, desired cost, acceptable risk profile, and required system specifications.

In general, a heat-dissipating lid having a unitary structure, such as the heat-dissipating lid 210 shown in FIG. 2, may have a more limited set of techniques from which it may be formed (e.g., additive manufacturing, sacrificial fabrication, over-molding, blow molding, or similar). However, if the heat-dissipation lid is constructed from multiple structures, as is heat-dissipation lid 1010 shown in FIG. 10, then a large variety of additional high- or low-volume production techniques may be employed, such as milling, turning, machining, stamping, casting, metal or plastic injection molding, EDM, or other, in addition to those mentioned for a unitary structure.

Any suitable fasteners may be used to create the physical joints between the multiple materials. The fasteners may be substantially permanent, such as would be the case when the fastener is a weld (e.g., friction stir, ultrasonic, etc.), braze, chemical bond, adhesive, epoxy, fusion bond, eutectic bond, or other such permanent fasteners. The fastener also may be a substantially removable, such as in the case of using a solder, screw and gasket, snap-fit, or other such removable fasteners. Due to issues in material compatibility, manufacturing techniques, availability of materials, joint strength requirements, joint hermeticity requirements, coolant compatibility, cleanliness, or other factors, different joints in the same assembly may utilize different types of fasteners.

Different components connected by joints 1032 and 1033 may be formed from the same or different materials, with uniform material or multi-material assemblies possible. Any suitable material may be selected for the multiple components, including without limitation, metal, plastic, semiconductor, or other. In many cases, a component comprising the first plate 1011 may be formed from a material of high thermal conductivity, such as aluminum, copper, silicon, silicon carbide, or other, due to the requirement that heat must be transmitted from the heat-generating device 1002 via thermal interface material 1003 into thermal communication with a flowing coolant. Material selected and used for the second plate 1016 may, or may not, be chosen not to be thermally conductive, as it is not a significant heat extraction pathway. A component comprising the second plate 1016 may be constructed out of a polymer, so as to, for example, reduce costs and improve material compatibility, compared to using a thermally conductive material. In some cases, special consideration may be given to compatibility between different components, especially components that may be in contact with the fluid chamber 1022, to avoid problems associated with absorption, galvanic corrosion, erosion, pressure containment, or other problems.

Although the example shown in FIG. 10 shows joint 1032 located between the second surface 1013 of plate 1011 and the second sidewall 1015, and also shows the joint 1033 located between the second sidewall 1015 and second plate 1016, it will be appreciated that any number and combination of joint locations are possible without departing from the scope of the present invention. For example, there may be no joint 1033, for which the lid 1010 may be formed from two parts instead of three with only a joint existing at joint 1032. There may similarly be no joint 1032, in which the lid 1010 may be formed from two parts instead of three but unique from an assembly where joint 1032 is present and joint 1033 is absent. Any combination of components of different manufacturing processes, joining techniques, joining locations, and materials are possible.

There may further or alternatively be a joint between first surface 1012 of first plate 1011 and first raised sidewall 1014. As discussed earlier, as first raised sidewall 1014 may set the distance between the circuit board 1001 and first surface 1012. A removable joint in such a scenario may be advantageous to easily adapt to board assemblies with heat-generating devices of different heights. That is, a first version of the component containing raised sidewall 1014 may be attached to the printed circuit board 1001 for a heat-generating device of a first height, and a second (different) version of the component containing raised sidewall 1014 with a different raised sidewall height may be attached for a heat-generating device of a second height. This may promote thin TIM thicknesses across a variety of product families without substantial customization. Furthermore, such a joint may not be required to be fluid-tight, for which a removable joint may make for easy modularity. A permanent joint is also possible.

Figure 11:
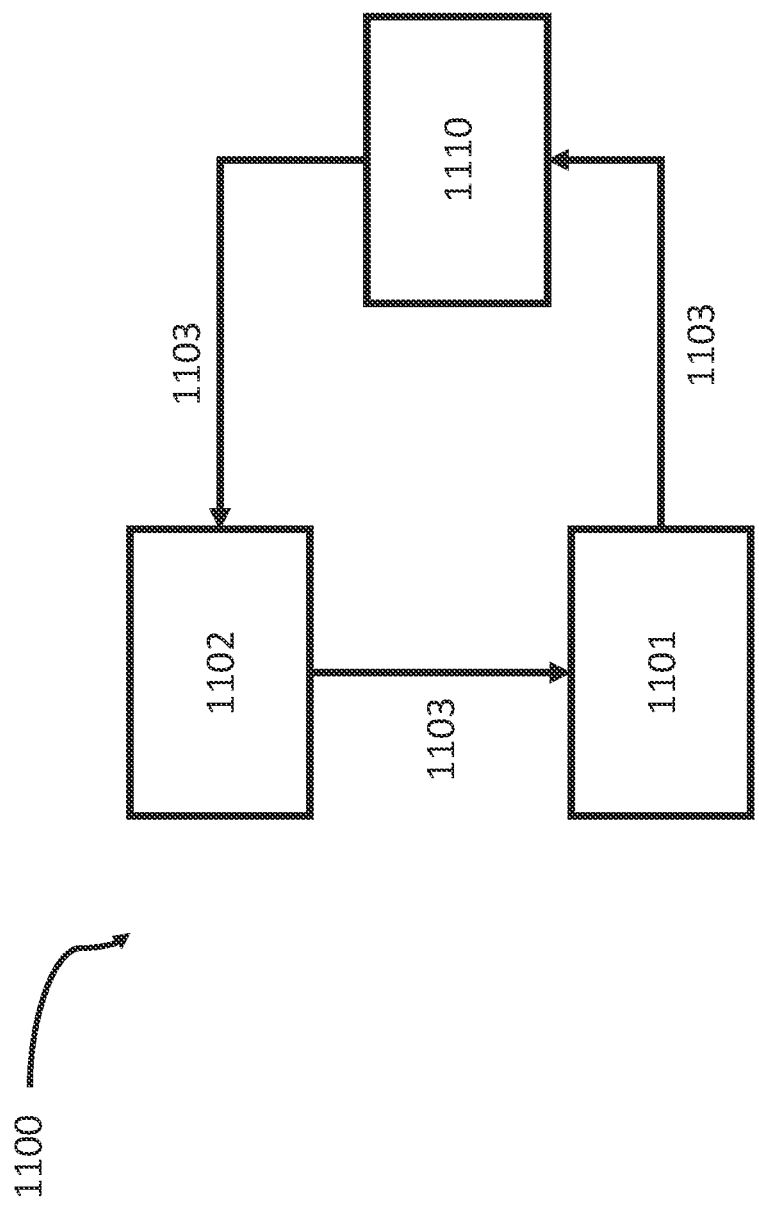
FIG. 11 shows a system-level block diagram implementation of a closed loop fluid system, the closed loop fluid system including a heat-dissipation lid according to one embodiment of the present invention.

FIG. 11 shows a system level block diagram implementation of a closed loop fluid system 1100 involving a heat-dissipation lid 1110. A pump 1101 creates a pressure differential causing fluid to flow through the closed loop fluid system. The fluid passes into heat-dissipation lid 1110, removes heat from a heat-generating device (not shown), and is exhausted at a lower pressure and higher temperature than it entered the heat-dissipation lid 1110. The heated fluid is then passed into a heat exchanger 1102 to remove the heat from the circulating coolant. The various components are connected via fluid conveyance elements 1103, such as tubes, piping, manifolds, quick disconnects, or similar.

The pump 1101 may be implemented using centrifugal force, axial flow, positive displacement, or any other suitable means of providing a pressure to drive fluid flow. The pump may be made of a wide variety of materials, whether thermally conductive metals, plastics, high strength metals, or other appropriate materials. Although pump 1101 is only shown as a single component, there may be multiple pumps placed in series or parallel to generate flow of the liquid coolant through the liquid-fluid loop assembly.

The heat exchanger 1102 can take on any suitable form. It may be a liquid-air heat exchanger, which may involve fans to drive flow to remove heat from the circulating coolant. It may be a liquid-liquid heat exchanger, which may interface with a facility cooling system. In certain scenarios, the facility coolant may be directly used in the heat-dissipation lids 1110.

The system may be implemented in different form factors. In a rack, for example, a closed loop system with liquid-air heat exchange may occur within a given server, whether in a 1 rack unit (1 U) form factor, or even 2 U or 4 U, or fractions thereof. In this scenario, each server may have its own pump and heat exchanger. It may be part of a CDU loop, whether in-rack or in-row, comprising a single centralized pump and heat exchanger Other fluid system components may also be included. For example, the system in which some embodiments of the present invention may be used may include filters, valves, manifolds, bypass loops, sensors (e.g., pressure, flow rate, temperature), quick disconnect fittings, or similar devices.

The present disclosure is not to be limited in scope by the specific embodiments described herein. Indeed, other various embodiments of and modifications to the present disclosure, in addition to those described herein, will be apparent to those or ordinary skill in the art from the foregoing description and accompanying drawings. Thus, such other embodiments and modifications are intended to fall within the scope of the claims. Furthermore, although the present disclosure has been described herein in the context of particular implementations and/or in the context of a particular environment for a particular purpose, those of ordinary skill in the art will recognize that its usefulness is not limited thereto, and that embodiments of the present invention may be beneficially implemented in any number of environments for any number of purposes. Accordingly, the claims set forth below should be construed in view of the full breadth and spirit of the present disclosure as described herein.

What is claimed is:

1. A heat-dissipation lid, comprising:
    a first plate formed from a thermally conductive material, having a first surface configured to be placed in thermal communication with a heat-generating device affixed to a printed circuit board or processor carrier, and a second surface located on an opposite side of said first plate from the first surface;
    a first raised sidewall extending from the first surface of the first plate, the first raised sidewall being configured for fastening the heat-dissipation lid to the printed circuit board or processor carrier with the first surface spaced apart from the printed circuit board or processor carrier such that the first raised sidewall, the first surface of the first plate and the printed circuit board or processor carrier together define a device chamber within which the heat-generating device will reside after the heat-dissipation lid is fastened to the printed circuit board or processor carrier;
    a second raised sidewall, extending from the second surface of the first plate;
    a second plate, connected to the second raised sidewall opposite from the second surface of the first plate, the second plate being spaced apart from the first plate so that the second raised sidewall, the second plate and the second surface of the first plate together define a fluid chamber within which a coolant fluid may flow, the fluid chamber being configured to prevent the cooling fluid from entering the device chamber;
    a third plate, disposed between the first plate and the second plate, and spaced apart from both the first plate and the second plate so that the third plate divides the fluid chamber into a first reservoir and a second reservoir, wherein the second surface of the first plate comprises a boundary of the second reservoir of the fluid chamber; and
    a plurality of nozzles fluidly connecting the first reservoir of the fluid chamber and the second reservoir of the fluid chamber, the plurality of nozzles being configured (i) to accelerate the coolant fluid passing out of the first reservoir of the fluid chamber and into the second reservoir of the fluid chamber, and (ii) to direct the coolant fluid flowing into the second reservoir to strike the second surface of the first plate;
    wherein at least some nozzles in the plurality of nozzles are arranged to form a first array of nozzles configured to accelerate the coolant fluid in a first specific region of the second surface;
    an inlet conduit, in fluid communication with the fluid chamber, configured to admit the coolant fluid into the fluid chamber; and
    an outlet conduit in fluid communication with the fluid chamber configured to let the coolant fluid pass out of the fluid chamber;
    whereby the coolant fluid admitted into the fluid chamber via the inlet conduit may directly contact and absorb heat from the second surface of the first plate in thermal communication with the heat-generating device before passing out of the fluid chamber via the outlet conduit.

2. The heat-dissipation lid of claim 1, wherein the second surface comprises a surface area enhancement feature, located within the first specific region, to increase an amount of heated surface area on the second surface that will be exposed to the coolant fluid flowing through the second reservoir.

3. The heat-dissipation lid of claim 1, wherein the second surface comprises a surface area enhancement feature, located outside the first specific region, to increase an amount of heated surface area on the second surface that will be exposed to the coolant fluid flowing through the second reservoir.

4. The heat-dissipation lid of claim 3, wherein the surface area enhancement features located outside the first specific region extend toward but do not touch the third plate.

5. The heat-dissipation lid of claim 3, wherein the surface area enhancement features located outside the first specific region extend toward and contact the third plate.

6. The heat-dissipation lid of claim 1, wherein at least some nozzles in the plurality of nozzles are arranged to form a second array of nozzles, the second array of nozzles spaced apart from the first array of nozzles and configured to accelerate the coolant fluid in a second specific region of the second surface, the second specific region being spaced apart from the first specific region of the second surface.

\* \* \* \* \*